US012368897B2

(12) United States Patent
Rabaud et al.

(10) Patent No.: US 12,368,897 B2
(45) Date of Patent: Jul. 22, 2025

(54) DYNAMIC BITSET CODING

(71) Applicant: Google LLC, Mountain View, CA (US)

(72) Inventors: Vincent Rabaud, Paris (FR); Pascal Massimino, Orsay (FR)

(73) Assignee: GOOGLE LLC, Mountain View, CA (US)

( * ) Notice: Subject to any disclaimer, the term of this patent is extended or adjusted under 35 U.S.C. 154(b) by 249 days.

(21) Appl. No.: 17/926,831

(22) PCT Filed: May 28, 2020

(86) PCT No.: PCT/US2020/034782
§ 371 (c)(1),
(2) Date: Nov. 21, 2022

(87) PCT Pub. No.: WO2021/242240
PCT Pub. Date: Dec. 2, 2021

(65) Prior Publication Data
US 2023/0199222 A1      Jun. 22, 2023

(51) Int. Cl.
*H04N 19/70*       (2014.01)
*H04N 19/157*      (2014.01)
*H04N 19/184*      (2014.01)

(52) U.S. Cl.
CPC ........... *H04N 19/70* (2014.11); *H04N 19/157* (2014.11); *H04N 19/184* (2014.11)

(58) Field of Classification Search
CPC ..... H03M 7/40; H03M 7/4093; H03M 7/6005
See application file for complete search history.

(56) References Cited

U.S. PATENT DOCUMENTS

| 5,848,195 A | 12/1998 | Romriell |
| 6,529,604 B1* | 3/2003 | Park .......................... H04B 1/66 381/23 |
| 9,756,342 B2 | 9/2017 | Cordara |
| 2007/0290899 A1 | 12/2007 | Monro et al. |
| 2013/0132675 A1* | 5/2013 | Sleiman .............. G06F 12/0864 711/E12.024 |
| 2013/0187798 A1 | 7/2013 | Marpe et al. |

(Continued)

OTHER PUBLICATIONS

Israel Koren et al: "Chapter 3" In: "Fault Tolerant Systems", Jan. 1, 2007, Morgan Kaufmann Publishers—Elsevier, San Francisco, CA, USA, pp. 55-102.

(Continued)

*Primary Examiner* — Md N Haque
(74) *Attorney, Agent, or Firm* — Young Basile Hanlon & MacFarlane, P.C.

(57) ABSTRACT

Decoding a bitset, each bit of the bitset corresponding to a respective value in a range of a minimum value to a maximum value, includes decoding, from a compressed bitstream, indexes of bits of the bitset, each bit of the bits having a first value. Decoding the bitset also includes setting all other bits of the bitset not decoded from the compressed bitstream to a second value. Decoding the indexes of bits of the bitset includes decoding a number of the indexes of the bits of the bitset, decoding a first index of the indexes in a first range having a first lower bound and a first upper bound, and decoding a last index of the indexes in a second range having a second lower bound and a second upper bound.

14 Claims, 11 Drawing Sheets

(56) References Cited

U.S. PATENT DOCUMENTS

| | | | | |
|---|---|---|---|---|
| 2015/0221315 | A1* | 8/2015 | Choo | G10L 21/00 |
| | | | | 704/500 |
| 2016/0232903 | A1* | 8/2016 | Choo | G10L 19/18 |
| 2019/0238893 | A1 | 8/2019 | Covell et al. | |
| 2020/0066285 | A1* | 2/2020 | Choo | G10L 19/0017 |

OTHER PUBLICATIONS

Anonymous, "Sparse matrix—Wikipedia", dated May 18, 2020, Retrieved from the Internet: URL: https://en.wikipedia.org/w/index.phptitle=Sparsematrix&oldid=957457885 on Dec. 1, 2020, 9 pgs.

Roman Starosolski, "Compressing High Bit Depth Images of Sparse Histograms", AIP Conference Proceedings 1060, pp. 269-272 (2007).

Anonymous, "Sparse data structures Issue #5 . scijs/contributing . GitHub", dated Mar. 5, 2015, Retrieved from the Internet: URL: https://github.com/scijs/contributing/issues/5 on Dec. 1, 2020, 3 pgs.

Anonymous, "Delta encoding—Wikipedia", dated Dec. 8, 2011, Retrieved from the Internet: URL: http://en.wikipedia.org/w/index.php?title=Delta encoding&oldid=464730749 on Mar. 18, 2015, 4 pgs.

International Search Report and Written Opinion of International Application No. PCT/US2020/034782, mailed Dec. 17, 2020, 19 pgs.

\* cited by examiner

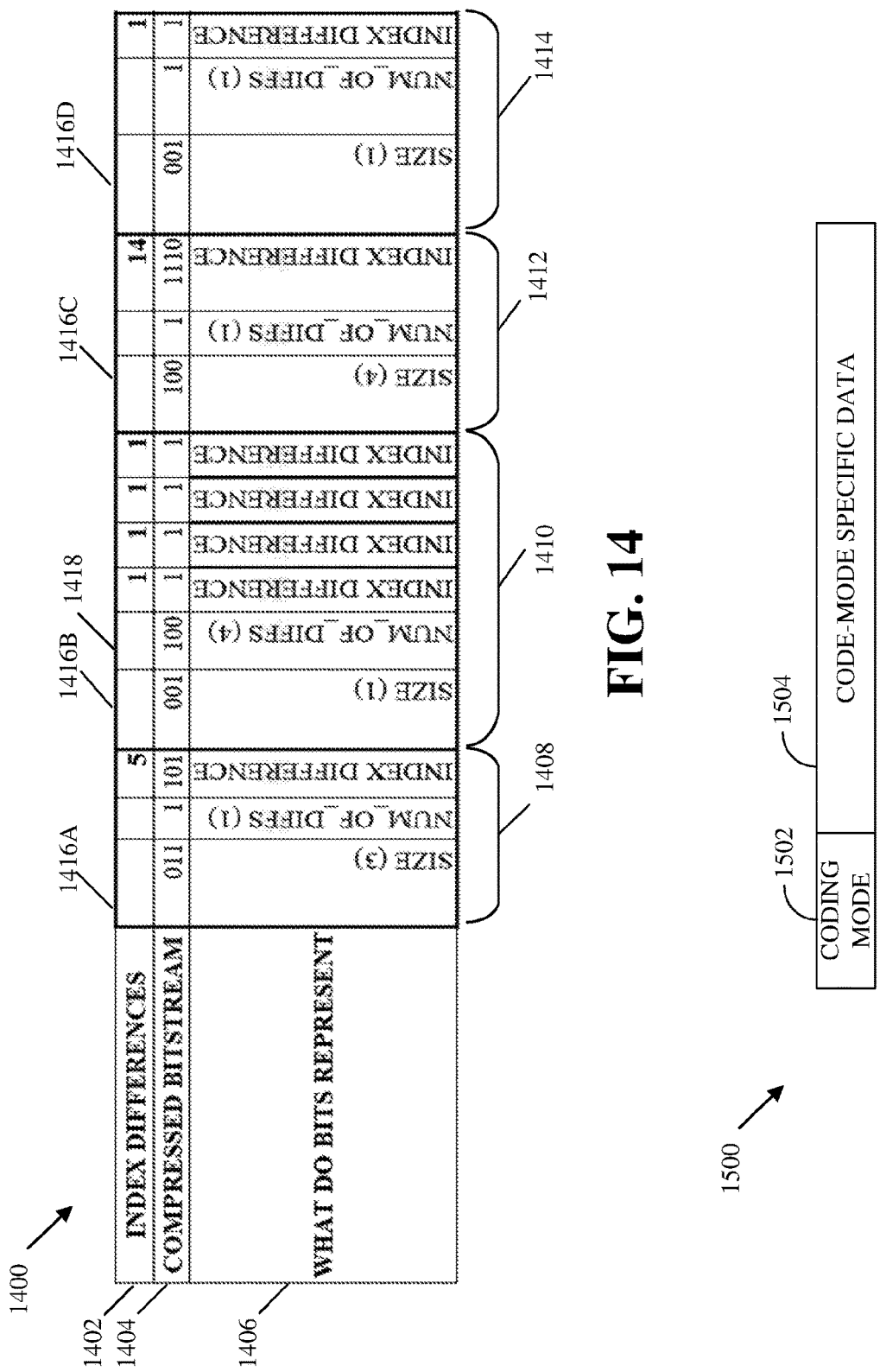

DYNAMIC BITSET CODING

BACKGROUND

Image content (e.g., still images or frames of video) represents a significant amount of online content. For example, a web page may include multiple images, and a large portion of the time and resources spent rendering the web page are dedicated to rendering those images for display. The amount of time and resources required to receive and render an image for display depends in part on the manner in which the image is compressed. As such, an image can be rendered faster by reducing the total data size of the image using compression and decompression techniques.

Different compression techniques can be used to compress (at an encoder) and corresponding decompression techniques at a decoder for different types of data. For examples, techniques such as Huffman coding, Lempel-Ziv-Welch compression, run-length encoding, Golomb coding, arithmetic coding, and the like can be used.

SUMMARY

A first aspect is an apparatus for decoding a bitset, each bit of the bitset corresponding to a respective value in a range of a minimum value to a maximum value. The apparatus includes a processor. The processor is configured to decode, from a compressed bitstream, indexes of bits of the bitset, each bit of the bits having a first value; and set all other bits of the bitset not decoded from the compressed bitstream to a second value. To decode the indexes of bits of the bitset includes to decode, from the compressed bitstream, a number of the indexes of the bits of the bitset; decode a first index of the indexes in a first range having a first lower bound and a first upper bound; and decode a last index of the indexes in a second range having a second lower bound and a second upper bound. The first lower bound is equal to the minimum value. The first upper bound is equal to the maximum value minus the number of the indexes of the bits of the bitset having the first value minus 1. The first index corresponds to a first bit of the bitset having the first value. The second lower bound is equal to the first index plus the number of the indexes minus one. The second upper bound is equal to the maximum value. The last index corresponds to a last bit of the bitset having the first value.

A second aspect is a method for decoding a bitset, each bit of the bitset corresponding to a respective value in a range of a minimum value to a maximum value. The method includes decoding, from a compressed bitstream, respective indexes of bits of the bitset having a first value, where the respective indexes include a first index and a second index; and setting every bit of the bitset between the first index and the second index to a second value that is a complement of the first value. Decoding the respective indexes of the bits includes obtaining the first index of a first bit of the bitset having the first value; setting a first bit at the first index of the bitset to the first value; decoding, from the compressed bitstream, a first index difference; adding the first index difference to the first index to obtain a second index; and setting the second index at the second index of the bitset to the first value.

A third aspect is a method for decoding a bitset having a length. The method includes decoding, from a compressed bitstream, a first number of first bits of the bitset having a first value; setting a first variable to the first number of the first bits of the bitset having the first value; setting a second variable to a number of second bits of the bitset having a complement of the first value; and performing, while more bits having the first value remain to be read and more bits having the complement of the first value remain to be read, operations including: reading, from the compressed bitstream, a bit; decrementing the first variable if the bit is equal to the first value; and decrementing the second value if the bit is equal to the complement of the first value.

A fourth aspect is an apparatus for decoding a bitset. The apparatus includes a processor. The processor configured to decode, from a compressed bitstream, a coding mode of the bitset; and decode, from the compressed bitstream, the bitset according to the coding mode. When the coding mode is a first value, the processor decodes the bitset as described in the first aspect. When the coding mode is a second value, the processor decodes the bitset using a first method of the second aspect. When the coding mode is a third value, the processor decodes the bitset using a second method of the third aspect.

These and other aspects of the present disclosure are disclosed in the following detailed description of the embodiments, the appended claims, and the accompanying figures.

It will be appreciated that aspects can be implemented in any convenient form. For example, aspects may be implemented by appropriate computer programs which may be carried on appropriate carrier media which may be tangible carrier media (e.g. disks) or intangible carrier media (e.g. communications signals). Aspects may also be implemented using suitable apparatus which may take the form of programmable computers running computer programs arranged to implement the methods and/or techniques disclosed herein. Aspects can be combined such that features described in the context of one aspect may be implemented in another aspect.

BRIEF DESCRIPTION OF THE DRAWINGS

FIG. 14 is an example of a diagram for explaining a compressed bitstream format that is used with many values, big range technique according to implementations of this disclosure.

FIG. 15 is an example of a portion of a compressed bitstream according to implementations of this disclosure.

DETAILED DESCRIPTION

Figure 1:
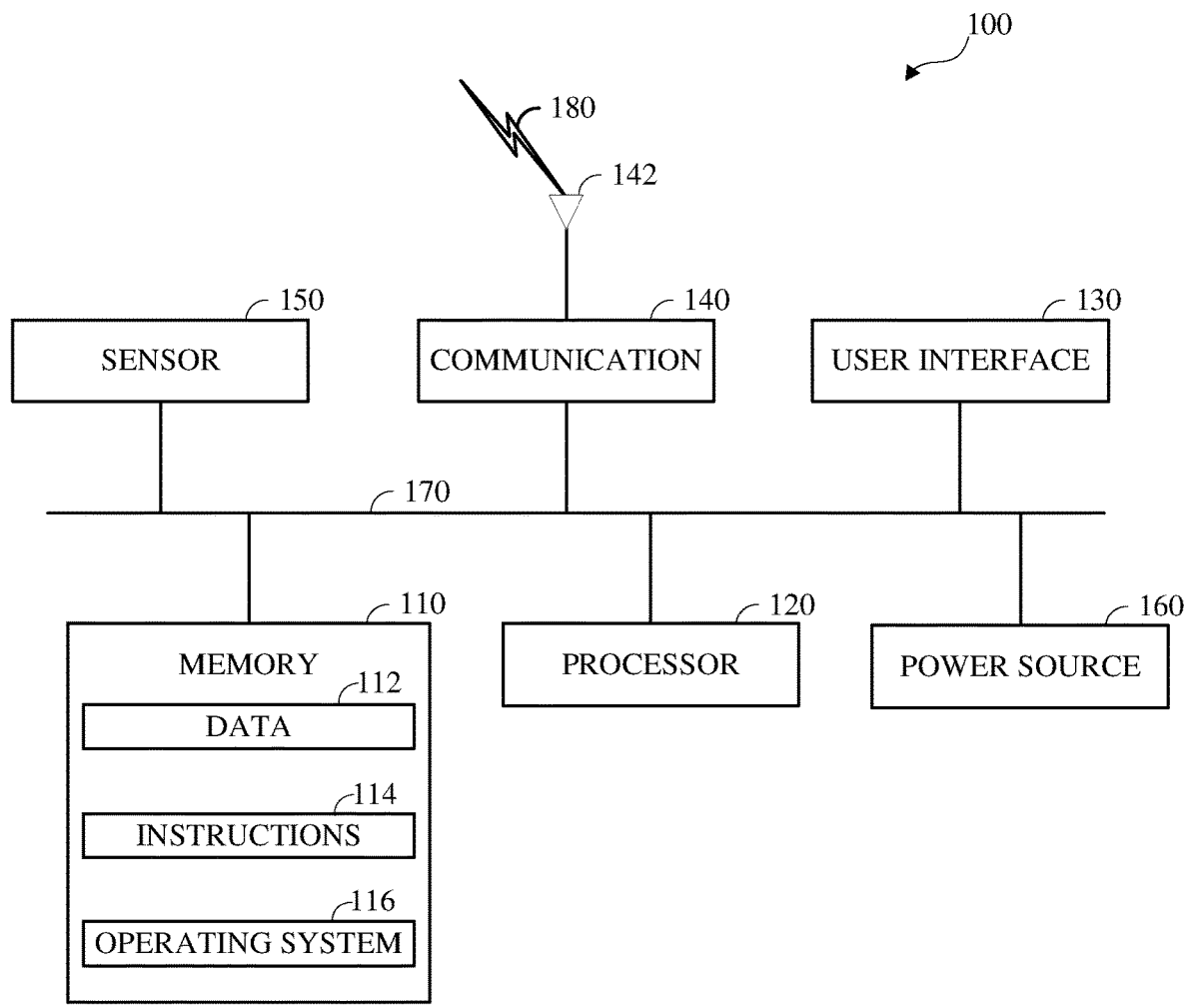
FIG. 1 is a diagram of a computing device in accordance with implementations of this disclosure.

Image (e.g., a standalone image or a frame of a video) coding includes coding many different types of data. Data types can mean data with different semantics. Examples of data types can include transform coefficients of residual values that result from prediction of blocks of the image, level map information of transform coefficients, histograms (such as of the distribution of color values in the image or in one or more blocks of the image), and so on. A level map can refer to a one-dimensional array of a transform block where each bit describes a characteristic of a corresponding transform coefficient. The one-dimensional array can be generated from the transform block using a scan order. In an example, the level map can be a non-zero map, which indicates which transform coefficients are zero and which are non-zero. In another example, the level map can indicate which coefficients are greater than a value (e.g., 1, 2, or some other value) and which are equal to the value.

Bitsets can be used to code, or in the coding of, such data types. A bitset, which may be called a bit string, is a sequence of bits where each bit can be interpreted as, for example, dark/light, absent/present, valid/invalid, yes/no, et cetera.

For illustration purposes, the techniques described herein are described with respect to coding (encoding and decoding) a bitset that represents occupancy (or presence) information. That is, each bit in the bitset indicates whether a value represented by that bit is present. "Present" in this context can mean that a count of the value is non-zero. The bit does not indicate to what level the corresponding value is present. However, the disclosure is not so limited.

For example, assume that a histogram of luminance values is to be decoded from a compressed bitstream. Assume further that the luminance values are represented with 4-bit values. Thus, each pixel can have a luminance value in the range [0, 15]. Assume further than in an image block of size 8×8, there are 10, 20, 30, and 4 pixels having the luminance values 0, 2, 4, and 14, respectively. No other luminance values are present in the image block. Thus a bitset, denoted BITSET, of the presence (occupancy) of all the possible luminance values is BITSET=101010000000010, where the BITSET[i] (i.e., the bit at location i within the bitset BITSET) is an index into the range of luminance values and corresponds to the luminance value i.

The bitset, BITSET, can simply be represented by an array of indexes of the non-zero bits within the bitset. Thus, the bitset 101010000000010 can be represented by the array [0, 2, 4, 14]. Knowing which bits of the bitset have one value (e.g., 1 or 0), it can be easily determined that the remaining bits of the bitset have the complementary value (e.g., 0 or 1).

While for simplicity of explanation histograms of luminance values may be used to illustrate the techniques disclosed herein, the disclosure is not limited.

Implementations according to this disclosure can be used to code a bitset in the most optimal way so as to reduce the number of bits required to compress the bitset. A bitset representing a data type can be coded using different methods depending on the characteristics of the bitset. The characteristics can include which bits have a certain value, the indexes of the such bits and their relative locations within the bitset, the length of the bitset. Coding efficiency can be improved when bitsets are coded using implementations according to this disclosure.

Details of dynamic bitset coding are described herein with initial reference to a system in which the teachings herein can be implemented.

FIG. 1 is a diagram of a computing device 100 in accordance with implementations of this disclosure. The computing device 100 shown includes a memory 110, a processor 120, a user interface (UI) 130, an electronic communication unit 140, a sensor 150, a power source 160, and a bus 170. As used herein, the term "computing device" includes any unit, or combination of units, capable of performing any method, or any portion or portions thereof, disclosed herein.

The computing device 100 may be a stationary computing device, such as a personal computer (PC), a server, a workstation, a minicomputer, or a mainframe computer; or a mobile computing device, such as a mobile telephone, a personal digital assistant (PDA), a laptop, or a tablet PC. Although shown as a single unit, any one element or elements of the computing device 100 can be integrated in any number of separate physical units. For example, the user interface 130 and processor 120 can be integrated in a first physical unit, and the memory 110 can be integrated in a second physical unit.

The memory 110 can include any non-transitory computer-usable or computer-readable medium, such as any tangible device that can, for example, contain, store, communicate, or transport data 112, instructions 114, an operating system 116, or any information associated therewith, for use by or in connection with other components of the computing device 100. The non-transitory computer-usable or computer-readable medium can be, for example, a solid state drive, a memory card, removable media, a read-only memory (ROM), a random-access memory (RAM), any type of disk including a hard disk, a floppy disk, an optical disk, a magnetic or optical card, an application-specific integrated circuit (ASIC), or any type of non-transitory media suitable for storing electronic information, or any combination thereof.

Although shown as a single unit, the memory 110 may include multiple physical units, such as one or more primary memory units, such as random-access memory units, one or more secondary data storage units, such as disks, or a combination thereof. For example, the data 112, or a portion thereof, the instructions 114, or a portion thereof, or both, may be stored in a secondary storage unit and may be loaded or otherwise transferred to a primary storage unit in conjunction with processing the respective data 112, executing the respective instructions 114, or both. In some implementations, the memory 110, or a portion thereof, may be removable memory.

The data 112 can include information, such as input audio and/or visual data, encoded audio and/or visual data, decoded audio and/or visual data, or the like. The visual data can include still images, frames of video sequences, and/or video sequences. The instructions 114 can include directions, such as code, for performing any method, or any portion or portions thereof, disclosed herein. The instructions 114 can be realized in hardware, software, or any combination thereof. For example, the instructions 114 may be implemented as information stored in the memory 110, such as a computer program, that may be executed by the processor 120 to perform any of the respective methods, algorithms, aspects, or combinations thereof, as described herein.

Although shown as included in the memory 110, in some implementations, the instructions 114, or a portion thereof, may be implemented as a special-purpose processor, or circuitry, that can include specialized hardware for carrying out any of the methods, algorithms, aspects, or combinations thereof, as described herein. Portions of the instructions 114 can be distributed across multiple processors on the same machine or different machines or across a network, such as a local area network, a wide area network, the Internet, or a combination thereof.

The processor 120 can include any device or system, now-existing or hereafter developed, capable of manipulating or processing a digital signal or other electronic information, including optical processors, quantum processors, molecular processors, or a combination thereof. For example, the processor 120 can include a special-purpose processor, a central processing unit (CPU), a digital signal processor (DSP), a plurality of microprocessors, one or more microprocessors in association with a DSP core, a controller, a microcontroller, an Application Specific Integrated Circuit (ASIC), a Field Programmable Gate Array (FPGA), a programmable logic array, a programmable logic controller, microcode, firmware, any type of integrated circuit (IC), a state machine, or any combination thereof. As used herein, the term "processor" includes a single processor or multiple processors.

The user interface 130 can include any unit capable of interfacing with a user, such as a virtual or physical keypad, a touchpad, a display, a touch display, a speaker, a microphone, a video camera, a sensor, or any combination thereof. For example, the user interface 130 may be an audio-visual display device, and the computing device 100 may present audio, such as decoded audio, using the user interface 130 audio-visual display device, such as in conjunction with displaying video, such as decoded video. Although shown as a single unit, the user interface 130 may include one or more physical units. For example, the user interface 130 may include an audio interface for performing audio communication with a user, and a touch display for performing visual and touch-based communication with the user.

The electronic communication unit 140 can transmit, receive, or transmit and receive signals via a wired or wireless electronic communication medium 180, such as a radio frequency (RF) communication medium, an ultraviolet (UV) communication medium, a visible light communication medium, a fiber-optic communication medium, a wireline communication medium, or a combination thereof. For example, as shown, the electronic communication unit 140 is operatively connected to an electronic communication interface 142, such as an antenna, configured to communicate via wireless signals.

Although the electronic communication interface 142 is shown as a wireless antenna in FIG. 1, the electronic communication interface 142 can be a wireless antenna, as shown, a wired communication port, such as an Ethernet port, an infrared port, a serial port, or any other wired or wireless unit capable of interfacing with a wired or wireless electronic communication medium 180. Although FIG. 1 shows a single electronic communication unit 140 and a single electronic communication interface 142, any number of electronic communication units and any number of electronic communication interfaces can be used.

The sensor 150 may include, for example, an audio-sensing device, a visible light-sensing device, a motion-sensing device, or a combination thereof. For example, the sensor 150 may include a sound-sensing device, such as a microphone, or any other sound-sensing device, now existing or hereafter developed, that can sense sounds in the proximity of the computing device 100, such as speech or other utterances, made by a user operating the computing device 100. In another example, the sensor 150 may include a camera, or any other image-sensing device, now existing or hereafter developed, that can sense an image, such as the image of a user operating the computing device. Although a single sensor 150 is shown, the computing device 100 may include a number of sensors 150. For example, the computing device 100 may include a first camera oriented with a field of view directed toward a user of the computing device 100 and a second camera oriented with a field of view directed away from the user of the computing device 100.

The power source 160 can be any suitable device for powering the computing device 100. For example, the power source 160 can include a wired external power source interface; one or more dry cell batteries, such as nickel-cadmium (NiCd), nickel-zinc (NiZn), nickel metal hydride (NiMH), lithium-ion (Li-ion); solar cells; fuel cells; or any other device capable of powering the computing device 100. Although a single power source 160 is shown in FIG. 1, the computing device 100 may include multiple power sources 160, such as a battery and a wired external power source interface.

Although shown as separate units, the electronic communication unit 140, the electronic communication interface 142, the user interface 130, the power source 160, or portions thereof, may be configured as a combined unit. For example, the electronic communication unit 140, the electronic communication interface 142, the user interface 130, and the power source 160 may be implemented as a communications port capable of interfacing with an external display device, providing communications, power, or both.

One or more of the memory 110, the processor 120, the user interface 130, the electronic communication unit 140, the sensor 150, or the power source 160 may be operatively coupled via a bus 170. Although a single bus 170 is shown in FIG. 1, a computing device 100 may include multiple buses. For example, the memory 110, the processor 120, the user interface 130, the electronic communication unit 140, the sensor 150, and the bus 170 may receive power from the power source 160 via the bus 170. In another example, the memory 110, the processor 120, the user interface 130, the electronic communication unit 140, the sensor 150, the power source 160, or a combination thereof, may communicate data, such as by sending and receiving electronic signals, via the bus 170.

Although not shown separately in FIG. 1, one or more of the processor 120, the user interface 130, the electronic communication unit 140, the sensor 150, or the power source 160 may include internal memory, such as an internal buffer or register. For example, the processor 120 may include internal memory (not shown) and may read data 112 from the memory 110 into the internal memory (not shown) for processing.

Although shown as separate elements, the memory 110, the processor 120, the user interface 130, the electronic communication unit 140, the sensor 150, the power source 160, and the bus 170, or any combination thereof, can be integrated in one or more electronic units, circuits, or chips.

Figure 2:
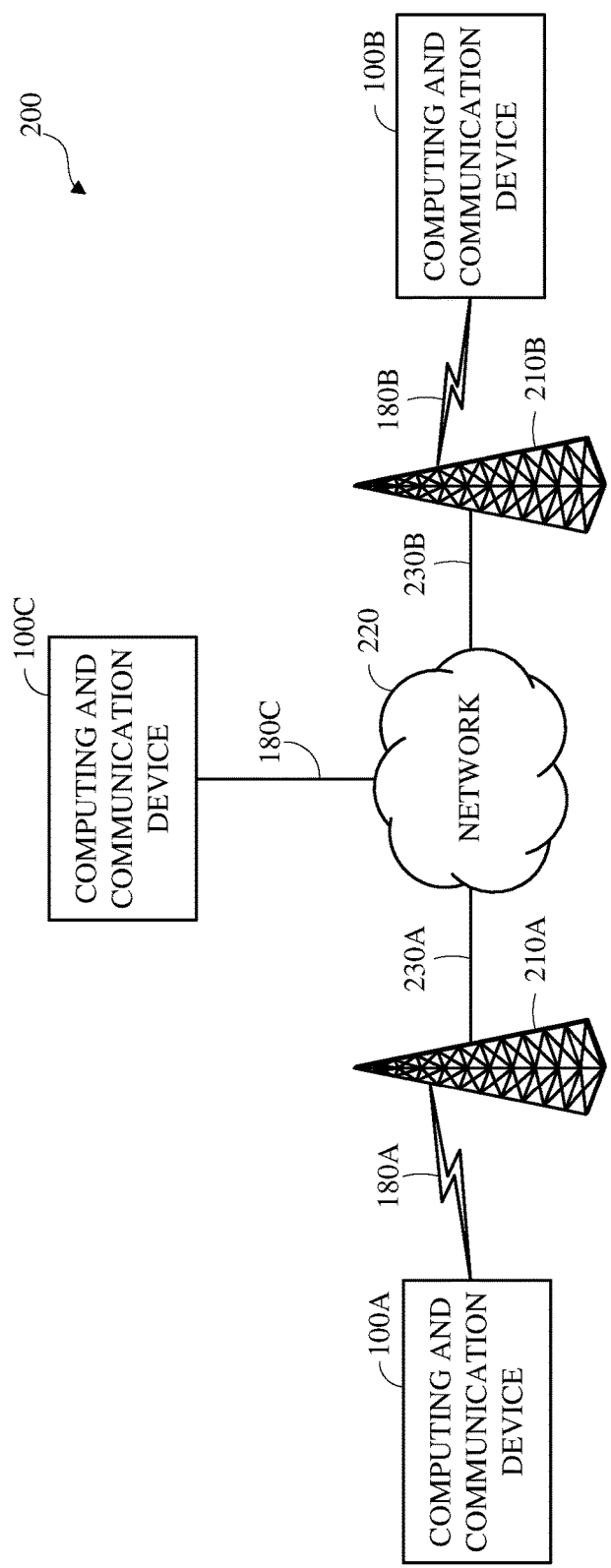
FIG. 2 is a diagram of a computing and communications system in accordance with implementations of this disclosure.

FIG. 2 is a diagram of a computing and communications system 200 in accordance with implementations of this disclosure. The computing and communications system 200 shown includes computing and communication devices 100A, 100B, 100C, access points 210A, 210B, and a network 220. For example, the computing and communications system 200 can be a multiple access system that provides communication, such as voice, audio, data, video, messaging, broadcast, or a combination thereof, to one or more wired or wireless communicating devices, such as the computing and communication devices 100A, 100B, 100C. Although, for simplicity, FIG. 2 shows three computing and communication devices 100A, 100B, 100C, two access points 210A, 210B, and one network 220, any number of computing and communication devices, access points, and networks can be used.

A computing and communication device 100A, 100B, or 100C can be, for example, a computing device, such as the computing device 100 shown in FIG. 1. For example, the computing and communication devices 100A, 100B may be user devices, such as a mobile computing device, a laptop, a thin client, or a smartphone, and the computing and communication device 100C may be a server, such as a mainframe or a cluster. Although the computing and communication device 100A and the computing and communication device 100B are described as user devices, and the computing and communication device 100C is described as a server, any computing and communication device may perform some or all of the functions of a server, some or all of the functions of a user device, or some or all of the functions of a server and a user device. For example, the server computing and communication device 100C may receive, encode, process, store, transmit, or a combination thereof, audio data; and one or both of the computing and communication device 100A and the computing and communication device 100B may receive, decode, process, store, present, or a combination thereof, the audio data.

Each computing and communication device 100A, 100B, 100C, which may include a user equipment (UE), a mobile station, a fixed or mobile subscriber unit, a cellular telephone, a personal computer, a tablet computer, a server, consumer electronics, or any similar device, can be configured to perform wired or wireless communication, such as via the network 220. For example, the computing and communication devices 100A, 100B, 100C can be configured to transmit or receive wired or wireless communication signals. Although each computing and communication device 100A, 100B, 100C is shown as a single unit, a computing and communication device can include any number of interconnected elements.

Each access point 210A, 210B can be any type of device configured to communicate with a computing and communication devices 100A, 100B, 100C, a network 220, or both via wired or wireless communication links 180A, 180B, 180C. For example, an access point 210A, 210B can include a base station, a base transceiver station (BTS), a Node-B, an enhanced Node-B (eNode-B), a Home Node-B (HNode-B), a wireless router, a wired router, a hub, a relay, a switch, or any similar wired or wireless device. Although each access point 210A, 210B is shown as a single unit, an access point can include any number of interconnected elements.

The network 220 can be any type of network configured to provide services, such as voice, data, applications, voice over internet protocol (VoIP), or any other communications protocol or combination of communications protocols, over a wired or wireless communication link. For example, the network 220 can be a local area network (LAN), wide area network (WAN), virtual private network (VPN), a mobile or cellular telephone network, the Internet, or any other means of electronic communication. The network can use a communication protocol, such as the Transmission Control Protocol (TCP), the User Datagram Protocol (UDP), the Internet Protocol (IP), the Real-time Transport Protocol (RTP), the HyperText Transport Protocol (HTTP), or a combination thereof.

The computing and communication devices 100A, 100B, 100C can communicate with each other via the network 220 using one or more wired or wireless communication links, or via a combination of wired and wireless communication links. For example, as shown, the computing and communication devices 100A, 100B can communicate via wireless communication links 180A, 180B, and computing and communication device 100C can communicate via a wired communication link 180C. Any of the computing and communication devices 100A, 100B, 100C may communicate using any wired or wireless communication link or links. For example, a first computing and communication device 100A can communicate via a first access point 210A using a first type of communication link, a second computing and communication device 100B can communicate via a second access point 210B using a second type of communication link, and a third computing and communication device 100C can communicate via a third access point (not shown) using a third type of communication link. Similarly, the access points 210A, 210B can communicate with the network 220 via one or more types of wired or wireless communication links 230A, 230B. Although FIG. 2 shows the computing and communication devices 100A, 100B, 100C in communication via the network 220, the computing and communication devices 100A, 100B, 100C can communicate with each other via any number of communication links, such as a direct wired or wireless communication link.

In some implementations, communications between one or more of the computing and communication devices 100A, 100B, 100C may omit communicating via the network 220 and may include transferring data via another medium (not shown), such as a data storage device. For example, the server computing and communication device 100C may store audio data, such as encoded audio data, in a data storage device, such as a portable data storage unit, and one or both of the computing and communication device 100A or the computing and communication device 100B may access, read, or retrieve the stored audio data from the data storage unit, such as by physically disconnecting the data storage device from the server computing and communication device 100C and physically connecting the data storage device to the computing and communication device 100A or the computing and communication device 100B.

Other implementations of the computing and communications system 200 are possible. For example, in an implementation, the network 220 can be an ad-hoc network and can omit one or more of the access points 210A, 210B. The computing and communications system 200 may include devices, units, or elements not shown in FIG. 2. For example, the computing and communications system 200 may include many more communicating devices, networks, and access points.

Figure 3:
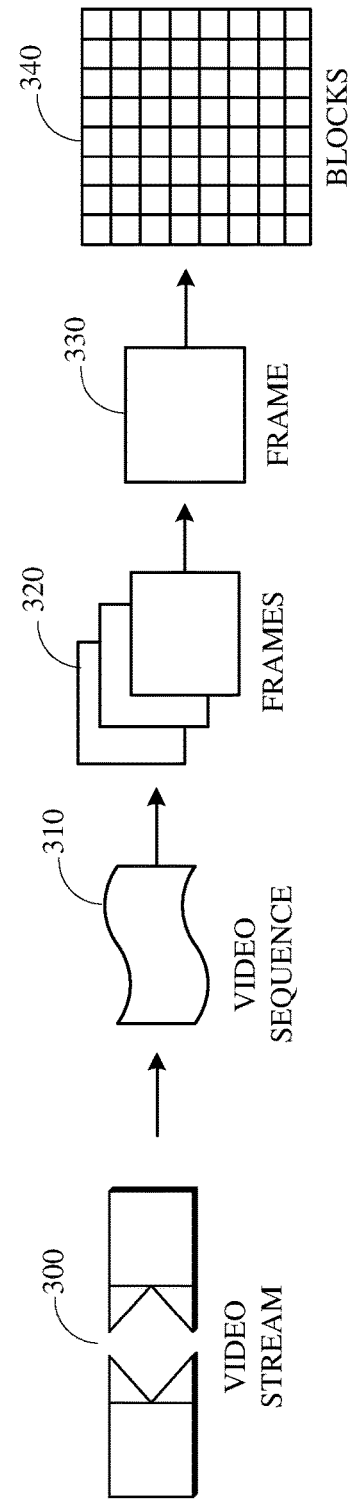
FIG. 3 is a diagram of a video stream for use in encoding and decoding in accordance with implementations of this disclosure.

FIG. 3 is a diagram of a video stream 300 for use in encoding and decoding in accordance with implementations of this disclosure. A video stream 300, such as a video stream captured by a video camera or a video stream generated by a computing device, may include a video sequence 310. The video sequence 310 may include a sequence of adjacent frames 320. Although three adjacent frames 320 are shown, the video sequence 310 can include any number of adjacent frames 320.

Each frame 330 from the adjacent frames 320 may represent a single image from the video stream. Although not shown in FIG. 3, a frame 330 may include one or more segments, tiles, or planes, which may be coded, or otherwise processed, independently, such as in parallel. A frame 330 may include blocks 340. Although not shown in FIG. 3, a block can include pixels. For example, a block can include a 16×16 group of pixels, an 8×8 group of pixels, an 8×16 group of pixels, or any other group of pixels. Unless otherwise indicated herein, the term "block" can include a superblock, a macroblock, a segment, a slice, or any other portion of a frame. A frame, a block, a pixel, or a combination thereof, can include display information, such as luminance information, chrominance information, or any other information that can be used to store, modify, communicate, or display the video stream or a portion thereof.

In some implementations, a frame that is not part of a video stream is encoded and decoded in accordance with implementations of this disclosure.

Figure 4:
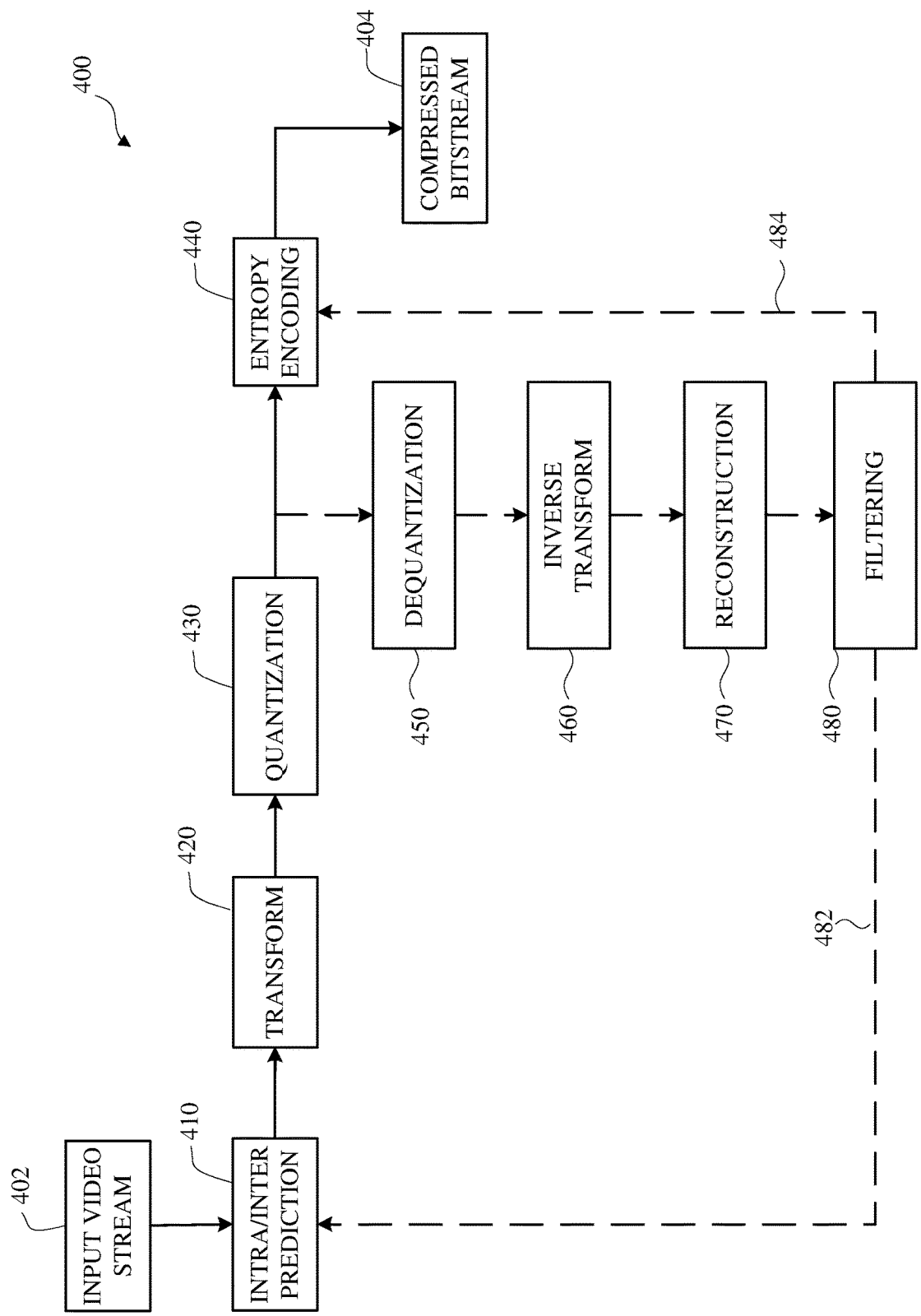
FIG. 4 is a block diagram of an encoder in accordance with implementations of this disclosure.

FIG. 4 is a block diagram of an encoder 400 in accordance with implementations of this disclosure. Encoder 400 can be implemented in a device, such as the computing device 100 shown in FIG. 1 or the computing and communication devices 100A, 100B, 100C shown in FIG. 2, as, for example, a computer software program stored in a data storage unit, such as the memory 110 shown in FIG. 1. The computer software program can include machine-readable instructions that may be executed by a processor, such as the processor 120 shown in FIG. 1, and may cause the device to encode video data as described herein. The encoder 400 can be implemented as specialized hardware included, for example, in the computing device 100.

The encoder 400 can encode an input video stream 402, such as the video stream 300 shown in FIG. 3, to generate an encoded (compressed) bitstream 404. In some implementations, the encoder 400 may include a forward path for generating the compressed bitstream 404. The input video stream 402 can be a single image or a collection of images. The forward path may include an intra/inter prediction unit 410, a transform unit 420, a quantization unit 430, an entropy encoding unit 440, or any combination thereof. In some implementations, the encoder 400 may include a reconstruction path (indicated by the broken connection lines) to reconstruct a frame for encoding of further blocks. The reconstruction path may include a dequantization unit 450, an inverse transform unit 460, a reconstruction unit 470, a filtering unit 480, or any combination thereof. Other structural variations of the encoder 400 can be used to encode the video stream 402.

For encoding the video stream 402, each frame within the video stream 402 can be processed in units of blocks. Thus, a current block may be identified from the blocks in a frame, and the current block may be encoded.

At the intra/inter prediction unit 410, the current block can be encoded using either intra-frame prediction, which may be within a single frame, or inter-frame prediction, which may be from frame to frame. Intra-prediction may include generating a prediction block from samples in the current frame that have been previously encoded and reconstructed. Inter-prediction may include generating a prediction block from samples in one or more previously constructed reference frames. Generating a prediction block for a current block in a current frame may include performing motion estimation to generate a motion vector indicating an appropriate reference portion of the reference frame. In the case of encoding a single image (e.g., an image that is not part of a video sequence and/or a sequence of images), the intra/inter prediction unit 410 can encode the image using intra-frame prediction.

The intra/inter prediction unit 410 may subtract the prediction block from the current block (raw block) to produce a residual block. The transform unit 420 may perform a block-based transform, which may include transforming the residual block into transform coefficients in, for example, the frequency domain. Examples of block-based transforms include the Karhunen-Loève Transform (KLT), the Discrete Cosine Transform (DCT), the Singular Value Decomposition Transform (SVD), the Fourier transform (FT), the Discrete Sine Transform (DST), and the Asymmetric Discrete Sine Transform (ADST). In an example, the DCT may include transforming a block into the frequency domain. The DCT may include using transform coefficient values based on spatial frequency, with the lowest frequency (i.e., Direct Current (DC)) coefficient at the top-left of the matrix and the highest frequency coefficient at the bottom-right of the matrix.

The quantization unit 430 may convert the transform coefficients into discrete quantum values, which may be referred to as quantized transform coefficients or quantization levels. The quantized transform coefficients can be entropy encoded by the entropy encoding unit 440 to produce entropy-encoded coefficients. Entropy encoding can include using a probability distribution metric. The entropy-encoded coefficients and information used to decode the block, which may include the type of prediction used, motion vectors, and quantizer values, can be output to the compressed bitstream 404. The compressed bitstream 404 can be formatted using various techniques, such as run-length encoding (RLE) and zero-run coding.

Figure 5:
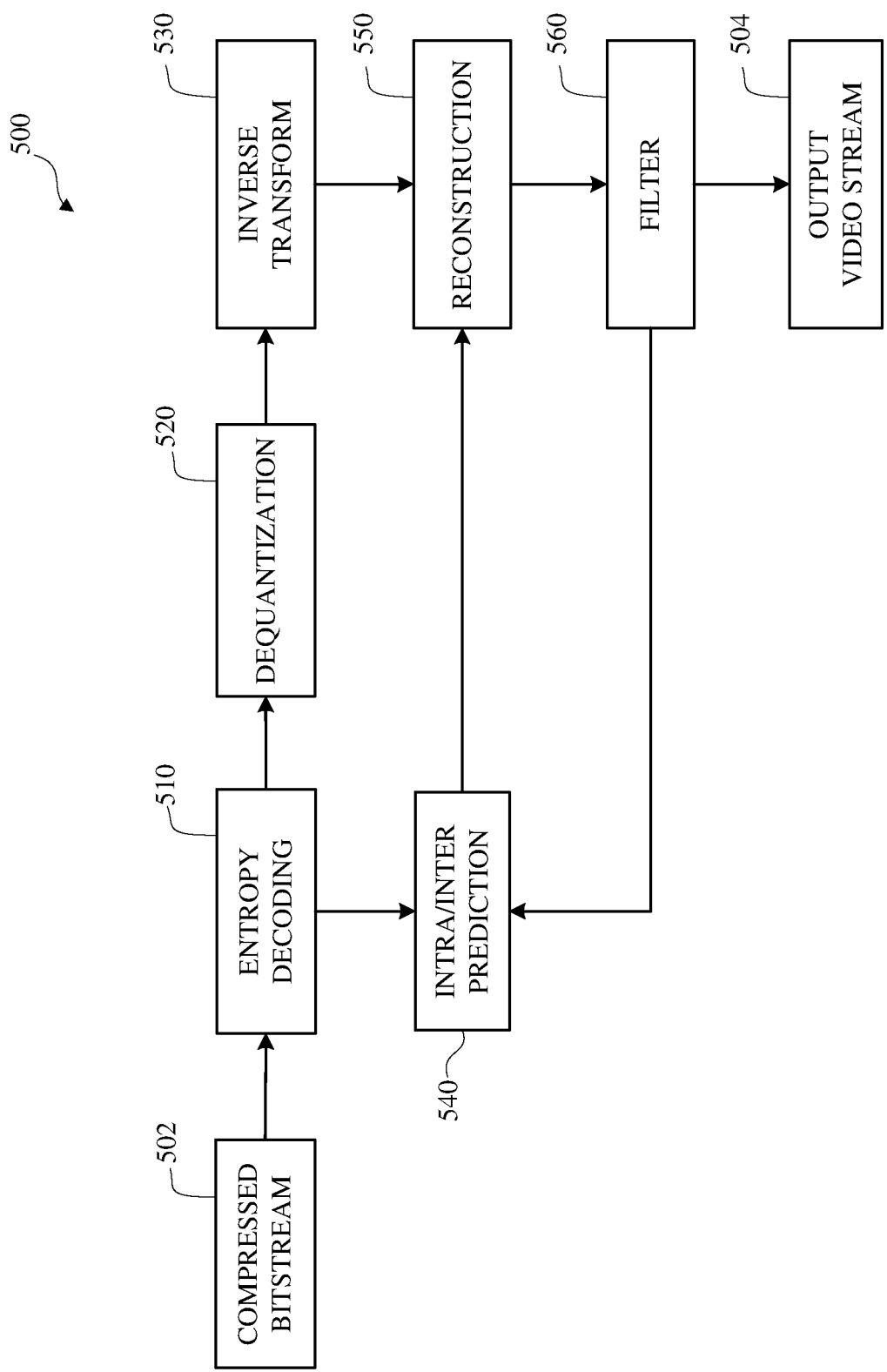
FIG. 5 is a block diagram of a decoder in accordance with implementations of this disclosure.

The reconstruction path can be used to maintain reference frame synchronization between the encoder 400 and a corresponding decoder, such as the decoder 500 shown in FIG. 5. The reconstruction path may be similar to the decoding process discussed below and may include decoding the encoded frame, or a portion thereof, which may include decoding an encoded block, which may include dequantizing the quantized transform coefficients at the dequantization unit 450 and inverse transforming the dequantized transform coefficients at the inverse transform unit 460 to produce a derivative residual block. The reconstruction unit 470 may add the prediction block generated by the intra/inter prediction unit 410 to the derivative residual block to create a decoded block. The filtering unit 480 can be applied to the decoded block to generate a reconstructed block, which may reduce distortion, such as blocking artifacts. Although one filtering unit 480 is shown in FIG. 4, filtering the decoded block may include loop filtering, deblocking filtering, or other types of filtering or combinations of types of filtering. The reconstructed block may be stored or otherwise made accessible as a reconstructed block, which may be a portion of a reference frame, for encoding another portion of the current frame, another frame, or both, as indicated by the broken line at 482. Coding information, such as deblocking threshold index values, for the frame may be encoded, included in the compressed bitstream 404, or both, as indicated by the broken line at 484.

Other variations of the encoder 400 can be used to encode the compressed bitstream 404. For example, a non-transform based encoder 400 can quantize the residual block directly without the transform unit 420. In some implementations, the quantization unit 430 and the dequantization unit 450 may be combined into a single unit.

FIG. 5 is a block diagram of a decoder 500 in accordance with implementations of this disclosure. The decoder 500 can be implemented in a device, such as the computing device 100 shown in FIG. 1 or the computing and communication devices 100A, 100B, 100C shown in FIG. 2, as, for example, a computer software program stored in a data storage unit, such as the memory 110 shown in FIG. 1. The computer software program can include machine-readable instructions that may be executed by a processor, such as the processor 120 shown in FIG. 1, and may cause the device to decode video data as described herein. The decoder 500 can be implemented as specialized hardware included, for example, in the computing device 100.

The decoder 500 may receive a compressed bitstream 502, such as the compressed bitstream 404 shown in FIG. 4, and may decode the compressed bitstream 502 to generate an output video stream 504. The decoder 500 may include an entropy decoding unit 510, a dequantization unit 520, an inverse transform unit 530, an intra/inter prediction unit 540, a reconstruction unit 550, a filtering unit 560, or any combination thereof. Other structural variations of the decoder 500 can be used to decode the compressed bitstream 502.

The entropy decoding unit 510 may decode data elements within the compressed bitstream 502 using, for example, Context Adaptive Binary Arithmetic Decoding, to produce a set of quantized transform coefficients. The dequantization unit 520 can dequantize the quantized transform coefficients, and the inverse transform unit 530 can inverse transform the dequantized transform coefficients to produce a derivative residual block, which may correspond to the derivative residual block generated by the inverse transform unit 460 shown in FIG. 4. Using header information decoded from the compressed bitstream 502, the intra/inter prediction unit 540 may generate a prediction block corresponding to the prediction block created in the encoder 400. At the reconstruction unit 550, the prediction block can be added to the derivative residual block to create a decoded block. The filtering unit 560 can be applied to the decoded block to reduce artifacts, such as blocking artifacts, which may include loop filtering, deblocking filtering, or other types of filtering or combinations of types of filtering, and which may include generating a reconstructed block, which may be output as the output video stream 504.

Other variations of the decoder 500 can be used to decode the compressed bitstream 502. For example, the decoder 500 can produce the output video stream 504 without the deblocking filtering unit 570.

Figure 6:
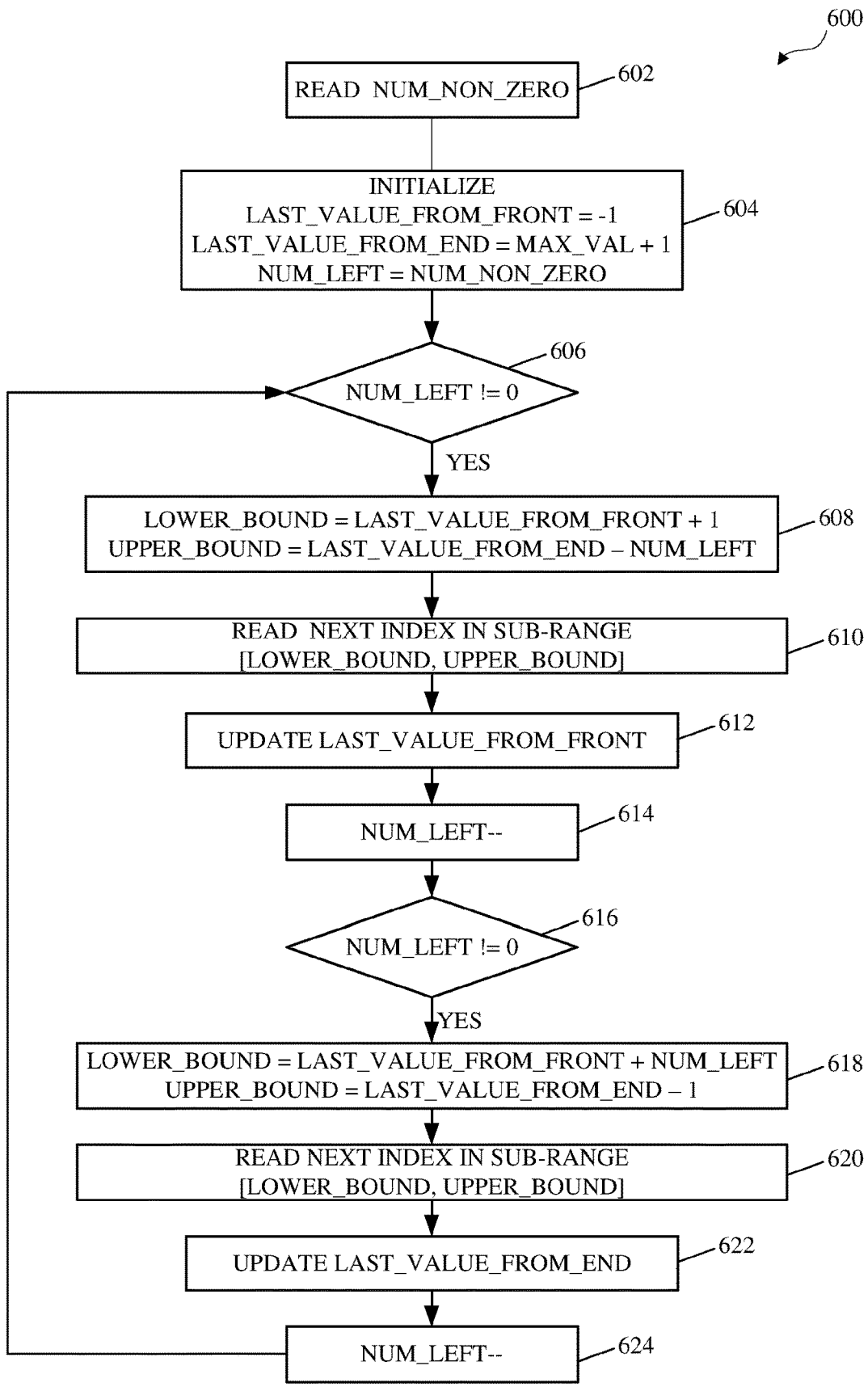
FIG. 6 is an example of a flowchart of a technique for decoding a bitset according to implementations of this disclosure.

FIG. 6 is an example of a flowchart of a technique 600 for decoding a bitset according to implementations of this disclosure. The bitset represents occupancy or presence information of values within a range. The technique 600 can be used in situations where a relatively small number of all the possible values in the range are present and where the range is relatively large. To give an illustrative example, the range can be [0, 255] and the number of presence values can be four. As such, the bitset may be, for example, BITSET=001111000 . . . 00, where the bitset length is 256 bits and the indexes of the present values are INDEXES=[2, 3, 4, 5]. For ease of reference, the technique of FIG. 6 is referred to as the "few values, big range" (FV_BR) technique. The technique 600 reads (e.g., decodes) the indexes from a compressed bitstream and reconstitutes (e.g., rebuilds the bitset) from the indexes.

The maximum value (MAX_VAL) in the range and the length (LEN) of the bitset can be related by the formula LEN=MAX_VAL+1. For example, if the range is [0, 1023], then the MAX_VAL=1023. The length of the bitset is MAX_VAL+1=1023+1=1024.

The technique 600 can be implemented, for example, as a software program that may be executed by computing and communication devices such as one of the computing and communication devices 100A, 100B, 100C of FIG. 1. The software program can include machine-readable instructions that may be stored in a memory such as the memory 110 of FIG. 1, and that, when executed by a processor, such as the processor 120 of FIG. 1, can cause the computing and communication device to perform the technique 600. The technique 600 can be implemented in whole or in part in the entropy decoding unit 510 of the decoder 500 of FIG. 5. The technique 600 can be implemented using specialized hardware or firmware. Multiple processors, memories, or both, may be used.

Figure 7:
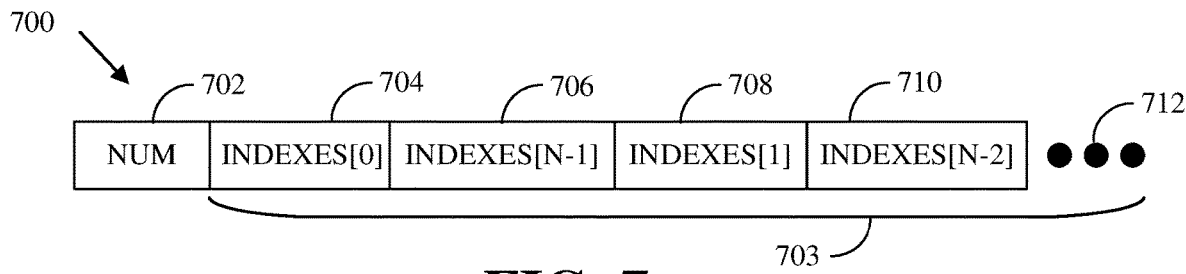
FIG. 7 is an example of a portion of a compressed bitstream that is decoded using the few values, big range technique according to implementations of this disclosure.

The technique 600 is described with respect to a compressed bitstream, such that the compressed bitstream 502 of FIG. 5 that includes data as described with respect to FIG. 7. FIG. 7 is an example of a portion 700 of a compressed bitstream that is decoded using the few values, big range (FV_BR) technique according to implementations of this disclosure.

The portion 700 encodes the values of the data structure INDEXES. A field 702 encodes the number of indexes (i.e., the size of the INDEXES data structure). A field 703 encodes all the indexes of the data structure INDEXES. The field 703 includes the indexes in an alternating head-tail fashion. That is, an index from the head of the INDEXES data structure (e.g., an index 704 at location 0) is encoded, then an index from the tail of the INDEXES data structure (e.g., an index 706 at location N−1) is encoded, then an index from the head of the INDEXES data structure (e.g., an index 708 at location 1) is encoded, then an index from the tail of the INDEXES data structure (e.g., an index 710 at location N−2) is encoded, until all indexes are encoded, as illustrated by an ellipsis 712.

An encoder, such as the encoder 400 of FIG. 4, encodes the portion 700 into a compressed bitstream, such as the compressed bitstream 404 of FIG. 4. For example, the encoder, or a technique implemented therein, can receive a histogram, construct the bitset from the histogram, construct the INDEXES data structure by determining which bits of the bitset have a first value (e.g., 1), encode the number of values of the INDEXES data structure to obtain the field 702, and alternatingly encode the index values 704-712 in the compressed bitstream.

Each of the indexes is encoded using a number of bits of the possible range of the index, as further described below. Each of the indexes can be coded (i.e., encoded by encoder and decoded by a decoder) using the number of bits of the possible range of the index using a range coder (i.e., range encoder at the encoder and range decoder at the decoder). For example, if an index is known to only be in the sub-range [20, 40] of the range [0, 255], then only 5 bits are required to encode the index as opposed to the 7 bits that would be required for encoding a value in the range [0, 255]. Thus, an index that is coded as 00000 would correspond to the value 20; an index that is coded as 00001 would correspond to the value 21, and so on. That is, the coded value would have to be added to the minimum bound of the sub-range to obtain the true value of the index. In another example, if the range is not a power of two, the number of bits can be optimized to a floating value using arithmetic coding. For example, an Asymmetric Numeral System (ANS) entropy coding technique can be used.

Returning to FIG. 6, at 602, the technique 600 reads the number of non-zero indexes (NUM_NON_ZERO) from the compressed bitstream. That is, the technique 600 reads the field 702 of FIG. 7. While the technique 600 is described with the field 702 encoding a number of ones, it can be readily appreciated that the technique 600 can be modified to decode a number of zero bits of the bitset in the field 702.

At 604, the technique 600 initializes a variable LAST_VALUE_FROM_FRONT to −1 (e.g., one less than the minimal possible value of the range), a variable LAST_VALUE_FROM_END to one more than the last possible value of the range (i.e., MAX_VAL), and a variable NUM_LEFT to the total number of indexes to be read (i.e., the value of the field 702). The variables LAST_VALUE_FROM_FRONT and LAST_VALUE_FROM_END are used to set, respectively, the lower and upper bounds of the sub-range that includes the value of the next index to be read from the compressed bitstream.

At 606, if there are more indexes to be read (e.g., if NUM_LEFT is not equal to 0), then the technique 600 proceeds to 608; otherwise, the technique 600 ends.

At 608, the technique 600 sets the lower bounds and upper bounds of the next index to be read from the head of the INDEXES data structure. The technique 600 sets the lower bound, LOWER_BOUND, to be one more than the value of the last index to be read from the head of INDEXES. Thus, LOWER_BOUND is set to LAST_VALUE_FROM_FRONT+1. The technique 600 sets the upper bound, UPPER_BOUND, to be LAST_VALUE_FROM_END−NUM_LEFT.

To illustrate, and assuming that there are 4 indexes to be read (i.e., NUM_NON_ZERO=4), when reading the very first index (e.g., the index 704), all that can be said about the index 704 is that it must be in the sub-range [0, 252]. The index 704 cannot be 253; otherwise, the remaining three indexes would have to be 254, 255, and 256. However, the value 256 is not possible as the range is [0, 255].

At 610, the technique 600 reads the next index (e.g., INDEXES[0]) in the sub-range [LOWER_BOUND, UPPER_BOUND]. For example, ceiling(log$_2$(UPPER_BOUND−LOWER_BOUND)) bits are read for INDEXES [0], where the function ceiling(x) maps x to the least integer that is greater than x. In another example, and as mentioned above, arithmetic coding can be used. For example, the number of bits need not be an integer and arithmetic coding can be used.

At 612, the technique 600 updates the variable LAST_VALUE_FROM_FRONT to be equal to the index that is read at 610. At 614, the technique 600 decrements the number of indexes remaining to be read (NUM_LEFT) by 1, since an index was read at 610.

At 616, the technique 600 performs the same test as described with respect to 606. If the number of indexes to be read is odd, then the technique 600 would proceed from 614 to end after all the indexes are read. On the other hand, when the number of indexes to be read is even, then the technique 600 would proceed from 606 to end after all the indexes are read.

At 618, the technique 600 sets the lower bounds and upper bounds of the next index to be read from the tail (i.e., end) of the INDEXES data structure. The technique 600 sets the lower bound, LOWER_BOUND, to be equal to the last index value from the front (LAST_VALUE_FROM_FRONT) plus the number of remaining indexes to be read (NUM_LEFT). The technique 600 sets the upper bound, UPPER_BOUND, to be one less than the last value read from the tail (i.e., LAST_VALUE_FROM_END−1).

To illustrate, and to continue from the above example, when reading the very first index from the tail (e.g., the index 706), all that can be said about the index 706 is that it must be in the sub-range [5, 255]. The index 706 cannot be 3 or 4 because the technique 600 knows that there are two more indexes to read, which are less than the index 706. Therefore, the index 706 cannot have a value that is less than 5.

At 620, the technique 600 reads the next index (e.g., INDEXES[N−1]) in the sub-range [LOWER_BOUND, UPPER_BOUND], which can be as described with respect to 610. At 622, the technique 600 updates the variable LAST_VALUE_FROM_END to be equal to the index that is read at 620. At 624, the technique 600 decrements the number of indexes remaining to be read (NUM_LEFT) by 1, since an index was read at 620. From 624, the technique 600 returns to 606.

To illustrate the operation of the technique 600, given values in the range [0, 255] and a bitset where the bits at indexes 2, 60, 200, and 255 are to be decoded, then the technique 600 reads the index 2 in the range [0, 252], the index 255 in the range [5, 255], the index 60 in the range [3, 253], and the index 200 in the range [61, 254].

As another example, given values in the range [0, 255] and a bitset where the bits at indexes 20, 250, 251, 254, and 255 are set (i.e., to be decoded), then the technique 600 read the index 20 in the range of [0, 251], the index 255 in the range [24, 255], the index 250 in the range [21, 252], the index 254 in the range [252, 254], and the index 251 in the range [251, 253].

In an example, after reading the indexes, the technique 600 can reconstitute the bitset based on the indexes that are read from the compressed bitstream. For example, bits corresponding to the indexes can be set to one value (e.g., 1) and all other bits of the bitset can be set to the opposite value (e.g., 0).

Figure 8:
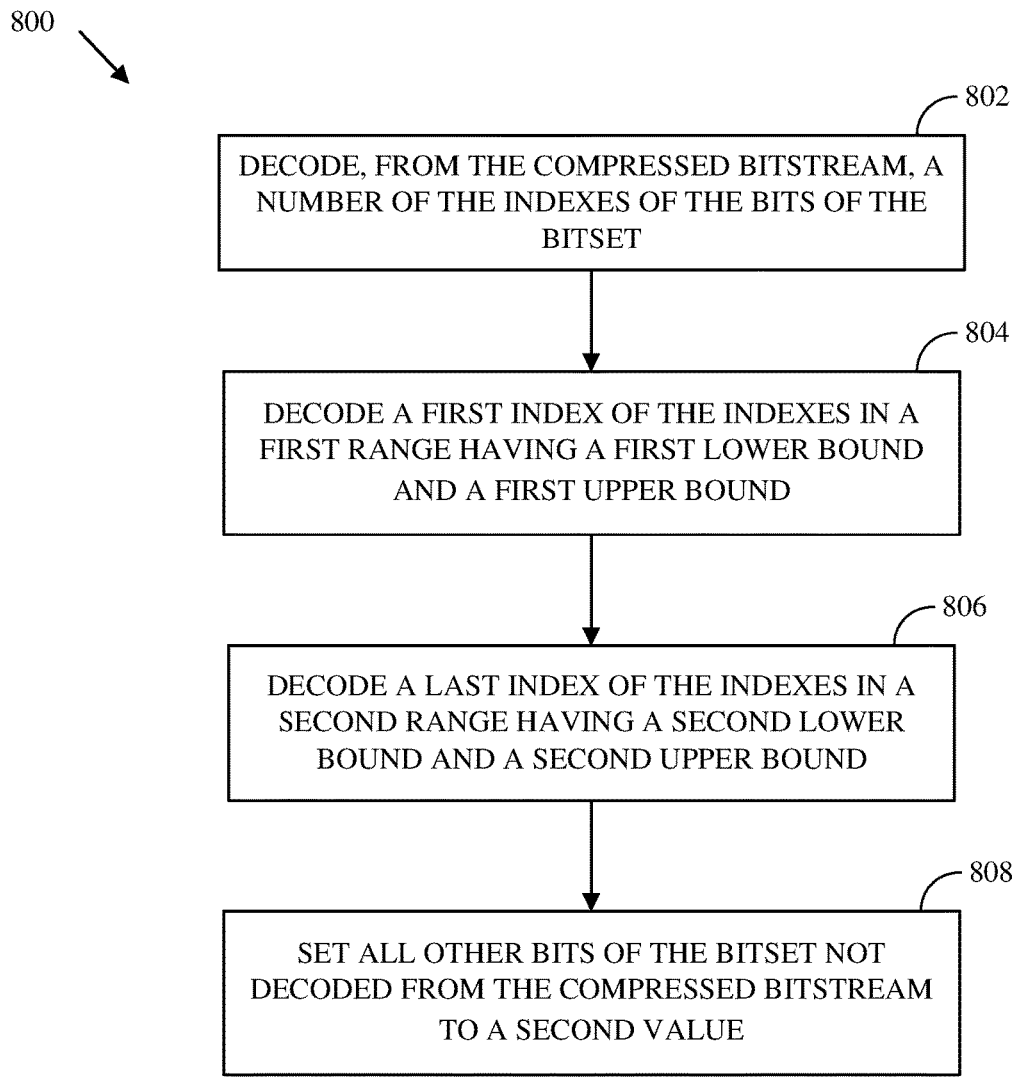
FIG. 8 is an example of a flowchart of a technique for decoding a bitset using few values, big range technique according to implementations of this disclosure.

FIG. 8 is an example of a flowchart of a technique 800 for decoding a bitset using few values, big range (FV_BR) according to implementations of this disclosure. The bitset can be as described with respect to FIG. 6. Each bit of the bitset corresponds to a respective value in a range of a minimum value (e.g., 0) to a maximum value (e.g., 255). The technique 800 decodes, from a compressed bitstream, indexes of bits of the bitset. Each bit of the bits has a first value (e.g., 1 or 0).

The technique 800 can be implemented, for example, as a software program that may be executed by computing and communication devices such as one of the computing and communication devices 100A, 100B, 100C of FIG. 1. The software program can include machine-readable instructions that may be stored in a memory such as the memory 110 of FIG. 1, and that, when executed by a processor, such as the processor 120 of FIG. 1, can cause the computing and communication device to perform the technique 800. The technique 800 can be implemented in whole or in part in the entropy decoding unit 510 of the decoder 500 of FIG. 5. The technique 800 can be implemented using specialized hardware or firmware. Multiple processors, memories, or both, may be used.

At 802, the technique 800 decodes, from the compressed bitstream, a number of the indexes of the bits of the bitset. The number of the indexes can be as described with respect to the field 702 of FIG. 7.

At 804, the technique 800 decodes a first index of the indexes in a first range having a first lower bound and a first upper bound. The first lower bound can be equal to the minimum value; the first upper bound can be equal to the maximum value minus the number of the indexes of the bits of the bitset that have the first value minus 1; and the first index can correspond to a first bit of the bitset having the first value. That is, the technique 800 can decode the first index as described above with respect to reading the index 704 of FIG. 7.

At 806, the technique 800 decodes a last index of the indexes in a second range having a second lower bound and a second upper bound. The second lower bound can be equal to the first index plus the number of the indexes minus one; the second upper bound can be equal to the maximum value; and the last index can correspond to a last bit of the bitset having the first value. The technique 800 can decode the last index as described above with respect to reading the index 706 of FIG. 7.

At 808, the technique 800 can set all other bits of the bitset not decoded from the compressed bitstream to a second value (e.g., 0 or 1). The second value is the binary complement of the first value.

In an example, the technique 800 can further include decoding, from the compressed bitstream, a coding mode that indicates the range and the number of the indexes of the bits of the bitset. For example, the technique 800 may be able to decode the bitset using many different decoding techniques. Thus, the compressed bitstream can include (i.e., included by an encoder) a coding mode indicating to the technique 800 that the FV_BR technique is to be used for decoding the bitset. In an example, the coding mode can precede the field 702 of FIG. 7.

In an example, the technique 800 can include decrementing a number of remaining indexes by one after decoding an index from the compressed bitstream, such as described with respect to 614 and 624 of FIG. 6.

In an example, the technique 800 can include decoding, from the compressed bitstream, a next index immediately after decoding a previous index that was decoded immediately after decoding a next previous index.

The next index can be a head index. For example, the next index can be the field 708. As such, the previous index can be the field 706 (i.e., a tail index), and the next previous index can be the field 704 (i.e., a head index). Thus, decoding the next index can include setting a lower bound of a remaining range to the next previous index plus 1, as described with respect to 608 of FIG. 6; setting an upper bound of a remaining range to the previous index minus the number of remaining indexes, as also described with respect to 608 of FIG. 6; and decoding, from the compressed bitstream, the next index in the remaining range, as described with respect to 610 of FIG. 6.

The next index can be a tail index. For example, the next index can be the field 710 of FIG. 7. As such, the previous index can be the field 708 (i.e., a head index), and the next previous index can be the field 706 (i.e., a tail index). Thus, decoding the next index can include setting a lower bound of a remaining range to the previous index plus the number of remaining indexes, as described with respect to 618 of FIG. 6; setting an upper bound of a remaining range to the next previous index minus 1, as also described with respect to 618 of FIG. 6; and decoding, from the compressed bitstream, the next index in the remaining range, as described with respect to 620 of FIG. 6.

Figure 9:
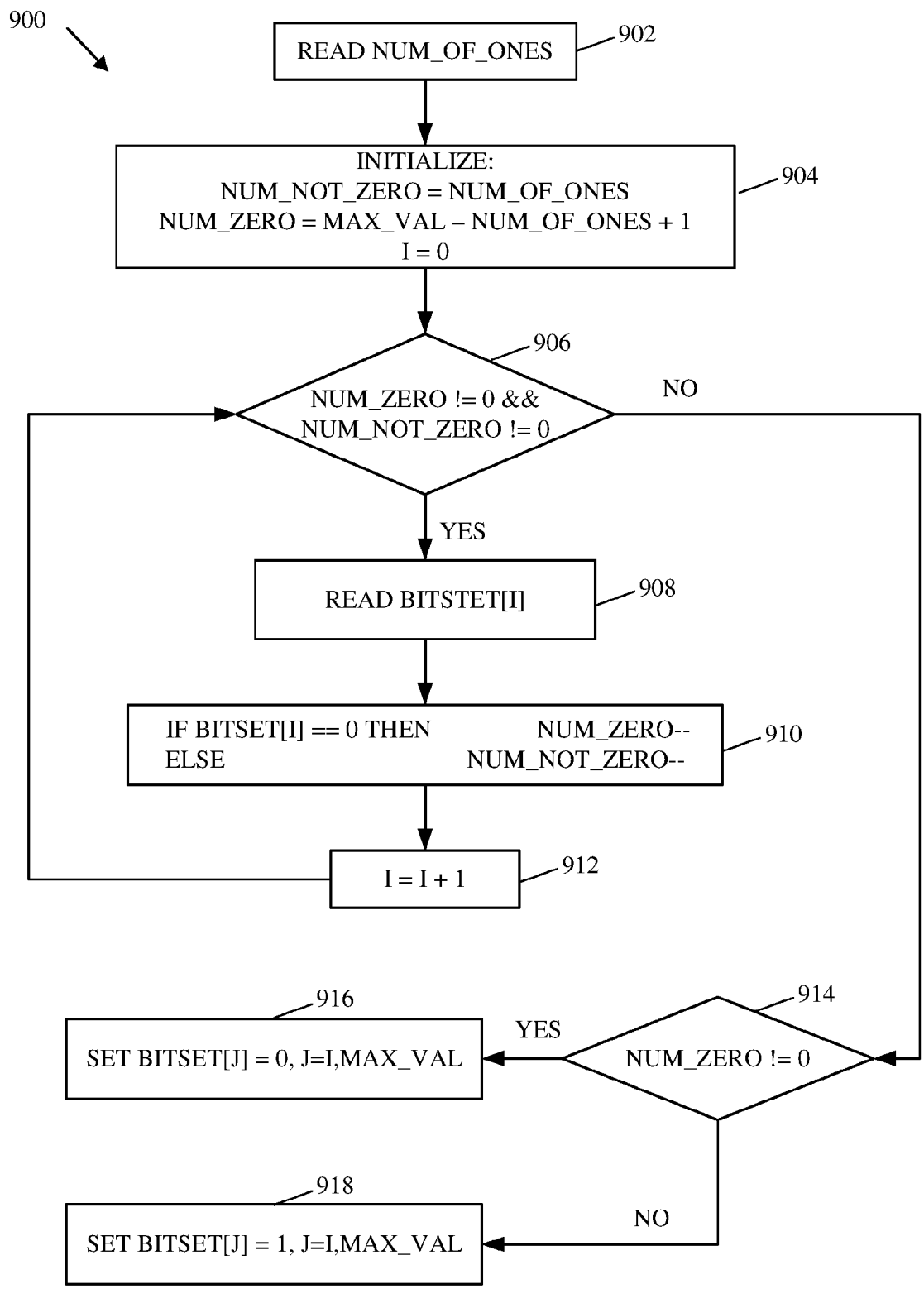
FIG. 9 is an example of a flowchart of a technique for decoding a bitset according to implementations of this disclosure.

FIG. 9 is an example of a flowchart of a technique 900 for decoding a bitset according to implementations of this disclosure. The bitset represents occupancy or presence information of values within a range. The technique 900 can be used in situations where a relatively small number of all the possible values in the range are present and where the range is relatively small. To give an illustrative example, the range can be [0, 15] and the number of present values can be four. As such, the bitset may be, for example, BITSET=001111000 . . . 00, where the bitset length is 16 bits and the bits at indexes [2, 3, 4, 5] are set to 1. For ease of reference, the technique of FIG. 9 is referred to as the "few values, small range" (FV_SR) technique.

The technique 900 can be implemented, for example, as a software program that may be executed by computing and communication devices such as one of the computing and communication devices 100A, 100B, 100C of FIG. 1. The software program can include machine-readable instructions that may be stored in a memory such as the memory 110 of FIG. 1, and that, when executed by a processor, such as the processor 120 of FIG. 1, can cause the computing and communication device to perform the technique 900. The technique 900 can be implemented in whole or in part in the entropy decoding unit 510 of the decoder 500 of FIG. 5. The technique 900 can be implemented using specialized hardware or firmware. Multiple processors, memories, or both, may be used.

Figure 10:
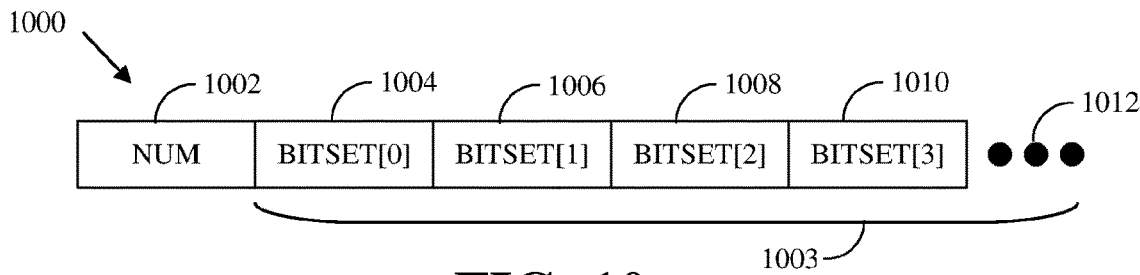
FIG. 10 is an example of a portion of a compressed bitstream that is decoded using the few values, small range technique according to implementations of this disclosure.

The technique 900 is described with respect to a compressed bitstream, such as the compressed bitstream 502 of FIG. 5 that includes data as described with respect to FIG. 10. FIG. 10 is an example of a portion 1000 of a compressed bitstream that is decoded using the few values, small range (FV_SR) technique according to implementations of this disclosure.

The portion 1000 includes a field 1002 that indicates a number of bits of the bitset having a certain value (i.e., either 0 or 1) in a field 1003. The Field 1003 includes a series of bits. A field 1004 includes the first bit of the bitset (i.e., BITSET[0]), a field 1006 includes the second bit of the bitset (i.e., BITSET[1]), and so on. That is, the fields 1004-1012 are each a sequence of bits.

At 902, the technique 900 reads, from the compressed bitstream, a number of ones (e.g., NUM_OF_ONES). That is, the technique 900 can read the field 1002 of FIG. 10. The number of ones indicates the number of bits of the bitset that are set to 1. While the technique 900 is described with the field 1002 encoding a number of ones, it can be readily appreciated that the technique 900 can be modified to encode a number of zeros in the field 1002.

At 904, the technique 904 initializes a variable NUM_NOT_ZERO to the number of ones, which is read from the compressed bitstream; a variable NUM_ZERO to the number of zero bits in the bitset; and a variable I to 0. The variable I is a looping variable that is used as an index into the bitset.

The variable NUM_NOT_ZERO is used to keep track of the number of 1 bits of the bitset that are not yet read from the compressed bitstream. Every time a 1 bit is read from the compressed bitstream, the variable NUM_NOT_ZERO is decremented by 1.

The variable NUM_ZERO is used to keep track of the number of 0 bits of the bitset that are not yet read from the compressed bitstream. Every time a 0 bit is read from the compressed bitstream, the variable NUM_ZERO is decremented by 1. The variable NUM_ZERO is initialized to the total number of bits in the bitset minus the number of one bits (i.e., NUM_OF_ONES). Thus, for example, if the bitset represents values in the range [0, 31] and NUM_OF_ONES is 3, then there are a total 29 bits that are 0 (i.e., MAX_VAL−NUM_OF_ONES+1=31-3+1=29). Equivalently, NUM_ZERO can be calculated as the length of the bitset minus the number of 1 bits.

At 906, the technique 900 tests whether either all 1 bits have been read or all 0 bits have been read, which is equivalent to testing whether there are still unread 0 bits (i.e., NUM_ZERO !=0) and there are still unread 1 bits (i.e., NUM_NOT_ZERO !=0). If so, then the technique 900 proceeds to 908; otherwise the technique 900 proceeds 914.

At 908, the technique 900 reads the next bit of the bitset (i.e., BITSET[I]) from the compressed bitstream. At 910, if the bit read at 908 is 0, then the technique 900 decrements the variable NUM_ZERO by 1; otherwise, the technique 900 decrements the variable NUM_NOT_ZERO. At 912, the loop variable I is incremented by 1. From 912, the technique 900 proceeds back to 906.

At 914, if the variable NUM_ZERO is not equal to zero, then it must be that not all 0 bits of the bitset were read from the bitstream. Thus, if at 914, NUM_ZERO is not equal to zero, then the technique 900 proceeds to 916 to set all remaining bits (i.e., from index I to MAX_VAL) of the bitset to 0 and ends; otherwise, the technique 900 proceeds to 918. On the other hand, if, at 914, NUM_ZERO is equal to zero, then the technique 900 proceeds to 918.

At 918, the technique 900 sets all of the remaining bits (i.e., from index I to MAX_VAL, if any) of the bitset to 1. The technique 900 then ends.

It is to be noted that when the test at 906 fails, the remaining unread bits of the bitset, if any, can be set to the complement of the last bit to be read at 908. Thus, in an implementation, the steps 914-918 can be replaced by a step SET BITSET[J]=~BITSET[I−1], for J=I, MAXVAL, where ~ is the bit complement operator.

To illustrate, assume that the bitset is 00110000. That is, the range is [0, 7] and the number of ones is 2. Thus, an encoder would simply encode 2 in the field 1002, a 0 in the field 1004, a 0 in the field 1006, a 1 in the field 1008, and a 1 in the field 1010. The encoder need encode any other bits in the compressed bitstream. The technique 900 reads (at 902) 2; initializes (at 904) NUM_NOT_ZERO to 2, NUM_ZERO to 6, and 1 to 0; reads (at 908) the first 0 (i.e., the field 1004, BITSET[0]); decrements (at 910) NUM_ZERO by 1 so that NUM_ZERO is now 5; reads (at 908) the second 0 (i.e., the field 1006, BITSET[1]); decrements (at 910) NUM_ZERO by 1 so that NUM_ZERO is now 4; reads (at 908) the first 1 (i.e., the field 1008, BITSET[2]); decrements (at 910) NUM_NOT_ZERO by 1 so that NUM_NOT_ZERO is now 1; reads (at 908) the second 1 (i.e., the field 1010, BITSET[3]); and decrements (at 910) NUM_NOT_ZERO by 1 so that NUM_NOT_ZERO is now 0. At this point, the technique 906 moves from 906 to 914. As NUM_ZERO is 4 (i.e., not 0), the technique sets (at 916) the remaining 4 bits of the bitset to zero.

As another example, assume that the bitset is 00111111. That is, the range is [0, 7] and the number of ones is 8. Thus, an encoder would simply encode 6 in the field 1002, a 0 in the field 1004, a 0 in the field 1006. The encoder need encode any other bits in the compressed bitstream. The technique 900 reads (at 902) 6; initializes (at 904) NUM_NOT_ZERO to 6, NUM_ZERO to 2, and 1 to 0; reads (at 908) the first 0 (i.e., the field 1004, BITSET[0]); decrements (at 910) NUM_ZERO by 1 so that NUM_ZERO is now 1; reads (at 908) the second 0 (i.e., the field 1006, BITSET[1]); and decrements (at 910) NUM_ZERO by 1 so that NUM_ZERO is now 0. At this point, the technique 906 moves from 906 to 914. As NUM_ZERO is 0, the technique 900 moves to 918. As NUM_NOT_ZERO is 6 (i.e., not 0), the technique sets (at 920) the remaining 6 bits of the bitset to one.

An encoder can have encoded the bitset that is decoded by the technique 900 by steps including encoding the field 1002 in the compressed bitstream; maintaining variables similar to the NUM_NOT_ZERO and NUM_ZERO described above; and writing each bit of the bitset, to the compressed bitstream, until either NUM_NO_ZERO becomes zero or NUM_ZERO becomes zero.

Figure 11:
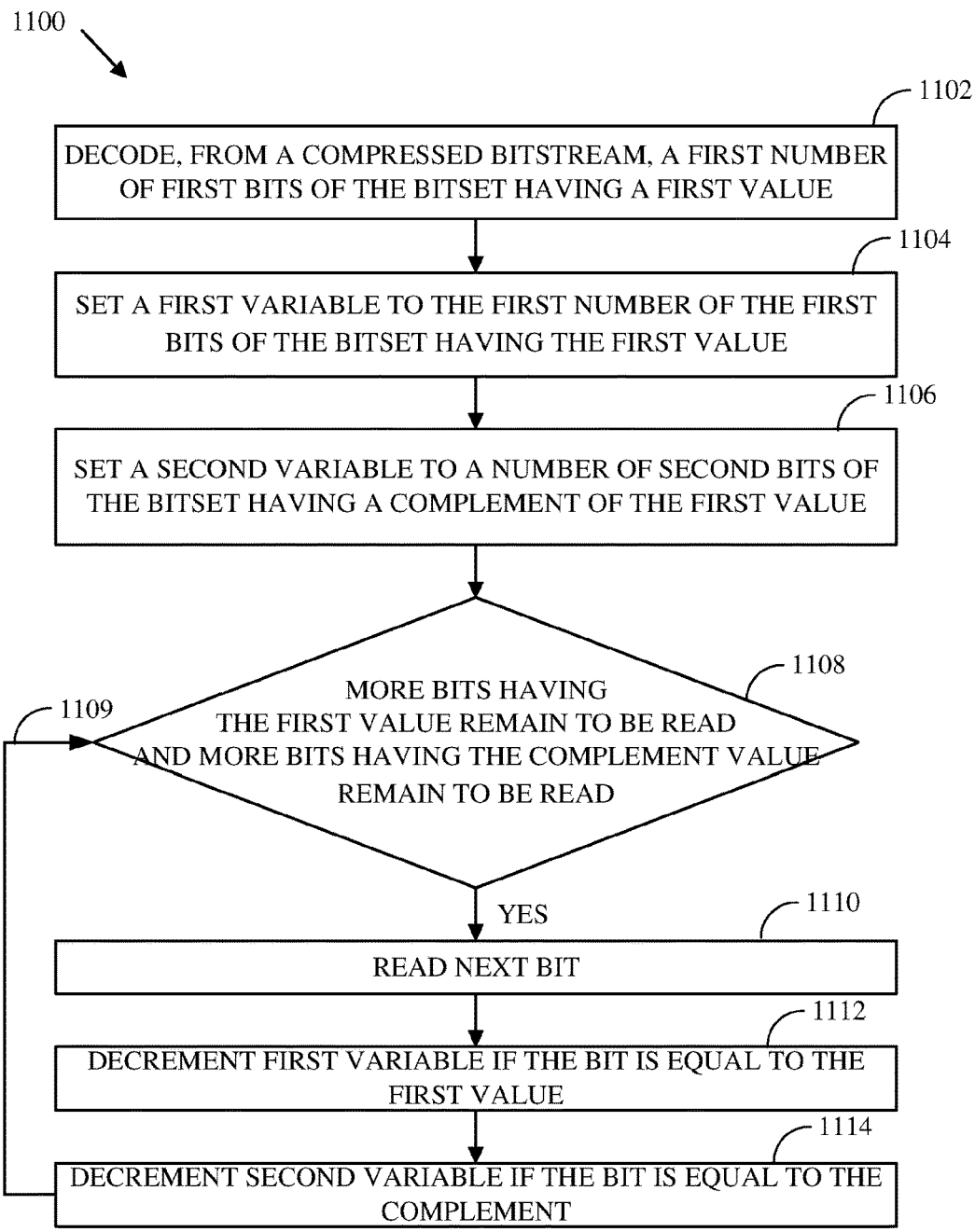
FIG. 11 is an example of a flowchart of a technique for decoding a bitset using few values, small range technique according to implementations of this disclosure.

FIG. 11 is an example of a flowchart of a technique 1100 for decoding a bitset using few values, small range (FV_SR) according to implementations of this disclosure. The bitset can be as described with respect to FIG. 9. In an example, each bit of the bitset can correspond to a respective value in a range of a minimum value (e.g., 0) to a maximum value (e.g., 7, 15, 31, or some other value). The technique 1100 decodes, from a compressed bitstream, bits of the bitset until a condition is met. Each bit of the bits has a first value (e.g., 1 or 0). If the first value is 1 (0), then the complement of the first value is 0 (1).

The technique 1100 can be implemented, for example, as a software program that may be executed by computing and communication devices such as one of the computing and communication devices 100A, 100B, 100C of FIG. 1. The software program can include machine-readable instructions that may be stored in a memory such as the memory 110 of FIG. 1, and that, when executed by a processor, such as the processor 120 of FIG. 1, can cause the computing and communication device to perform the technique 800. The technique 1100 can be implemented in whole or in part in the entropy decoding unit 510 of the decoder 500 of FIG. 5. The technique 1100 can be implemented using specialized hardware or firmware. Multiple processors, memories, or both, may be used.

At 1102, the technique 1100 decodes, from a compressed bitstream, a first number of first bits of the bitset having a first value. The compressed bitstream can be compressed bitstream 502 of FIG. 5. The first number of the first bits can be as described with respect to the field 1002 of FIG. 10. In an example, the first value can be 1 and a complement of the value can be 0. In another example, the first value can be 0 and the complement of the value can be 1.

At 1104, the technique 1100 sets a first variable to the first number of the first bits of the bitset having the first value. In an example, the first variable can be as described with respect to the variable NUM_NOT_ZERO of FIG. 9. At 1106, the technique 1100 sets a second variable to a number of second bits of the bitset having a complement of the first value. In an example, the second variable can be as described with respect to the variable NUM_ZERO of FIG. 9. Thus, setting the second variable to the number of second bits of the bitset having the complement of the first value can include setting the second variable to the length minus the first number of the first bits of the bitset having the first value.

At 1106, the technique 1100 tests whether more bits having the first value remain to be read and more bits having the complement of the first value remain to be read, as described with respect to 906 of FIG. 9. While the test is successful (as indicated by a looping arrow 1109), the technique 1100 performs the steps 1110-1114, as described with respect to 908-910 of FIG. 9.

At 1110, the technique 1100 reads, from the compressed bitstream, a bit (i.e., the next bit of the bitset). At 1112, the technique 1100 decrements the first variable if the bit is equal to the first value. At 1114, the technique 1100 decrements the second value if the bit is equal to the complement of the first value. From 1114, the technique 1100 returns to 1108.

In an example, the technique 1100 can include setting remaining bits of the bitset to the first value after no more bits having the first value remain to be read or no more bits having the complement of the first value remain to be read, as described with respect to 918-920 of FIG. 9. In an example, the technique 1100 can include setting remaining bits of the bitset to the complement of the first value after no more bits having the first value remain to be read or no more bits having the complement of the first value remain to be read, as described with respect to 914-916 of FIG. 9. In an example, the technique 1100 can include setting remaining bits of the bitset to a complement of a last bit value read from the compressed bitstream after no more bits having the first value remain to be read or no more bits having the complement of the first value remain to be read.

Each bit of the bitset can indicate presence of a respective value in a range. In an example, the technique 1100 can further include decoding, from the compressed bitstream, a coding mode that is indicative of the range and the first number of the first bits. For example, the technique 1100 may be able to decode a bitset using many different decoding techniques. Thus, the compressed bitstream can include (i.e., included by an encoder) a coding mode indicating to the technique 1100 that the FV_SR technique is to be used for decoding the bitset. In an example, the coding mode can precede the field 1002 of FIG. 10.

In some situations, the bitset can represent many values in a small range. A technique for decoding such bitsets is referred to herein a many values, small range (MV_SR), for ease of reference.

Some coding techniques, such as entropy coding, rely upon probability models that model the distribution of values occurring. By using probability models (i.e., probability distributions) based on a measured or estimated distribution of values, entropy coding can reduce the number of bits required to represent data (e.g., image or video data) close to a theoretical minimum. A probability distribution can be used by an entropy coding engine, such as arithmetic coding, Huffman coding, and other variable-length-to-variable-length coding engines.

Figure 12:
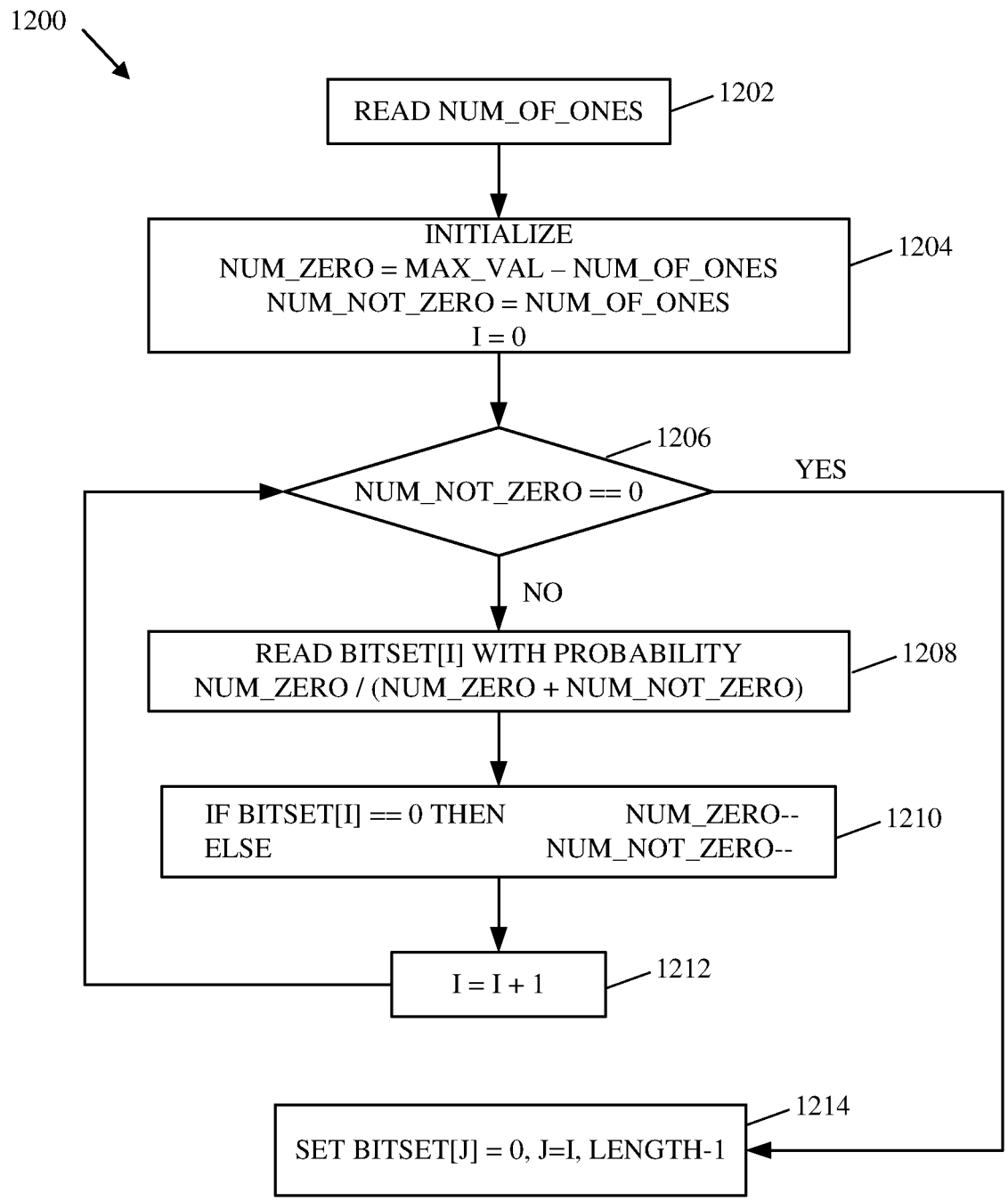
FIG. 12 is an example of a flowchart of a technique for decoding a bitset using many values, small range technique according to implementations of this disclosure.

FIG. 12 is an example of a flowchart of a technique 1200 for decoding a bitset using many values, small range (MV_SR) according to implementations of this disclosure. The technique 1200 can be implemented, for example, as a software program that may be executed by computing and communication devices such as one of the computing and communication devices 100A, 100B, 100C of FIG. 1. The software program can include machine-readable instructions that may be stored in a memory such as the memory 110 of FIG. 1, and that, when executed by a processor, such as the processor 120 of FIG. 1, can cause the computing and communication device to perform the technique 1200. The technique 1200 can be implemented in whole or in part in the entropy decoding unit 510 of the decoder 500 of FIG. 5. The technique 1200 can be implemented using specialized hardware or firmware. Multiple processors, memories, or both, may be used.

The MV_SR technique uses progressive probabilities to decode a next bit from a compressed bitstream. In a progressive arithmetic coding method, such as described with respect to FIG. 12, the probability distribution can be adjusted after coding each bit of the bitset. The adjusted probability distribution can be used to code the next bit. For example, an encoder can first send a count of the number of bits having a first value (e.g., 1). "Send" can mean transmit to a decoder via a compressed bitstream, encode in a stored bitstream that can be later decoded by a decoder, and the like. The number of bits having the first value can be encoded in and decoded (by a decoder) from the bitstream.

The length of the bitset can be known a priori by the decoder or can be sent by the encoder in the compressed bitstream. In an example, the length can correspond to the maximum value plus 1 (i.e., MAX_VAL+1) in a range [0, MAX_VAL]. As described above, each bit in the bitset can indicate presence of a corresponding value of the range. More generally, if the range is [MIN, MAX], then the length of the bitset is given by MAX-MIN+1.

To illustrate, assume that the bitset is of length L and that there are M bits having the first value. For the very first bit of the bitset, the probability that the bit has the first value (e.g., has a value of 1) is given by equation (1):

$$P(\text{next bit} = 1) = \frac{M}{L} \qquad (1)$$

For all subsequent bits, the best probability estimate for the bit having the first value (e.g., equal to 1) is given by equation (2)

$$P(\text{next bit} = 1) = \frac{\text{remaining unread of bits having the first value}}{\text{remaining number of unread bits}} \qquad (2)$$

The decoder can update the probability estimates without additional information (e.g., syntax elements in the compressed bitstream) from the encoder.

The technique 1200 is further described with respect to adjusting the probability of the next bit being the complement of the first value wherein the technique 1200 decodes (e.g., reads) the number of bits that have the first value in the bitset.

At 1202, the technique 1200 reads, from the compressed bitstream, a number of bits that are set to 1 (e.g., a first value) in the bitset. In an example, the first value can be 0. At 1204, the technique 1200 initializes variables NUM_ZERO, NUM_NOT_ZERO, and I, as described with respect to 904 of FIG. 9.

At 1206, the technique 1200 determines whether all 1 bits have been read from the compressed bitstream. If so, then the technique 1200 proceeds to 1214; otherwise, the technique 1200 proceeds to 1208 to read the next bit (i.e., BITSET[I]). At 1208, the next bit (i.e., BITSET[I]) is read with the probability given by equation (3).

$$P(\text{BITSET}[I]=0)=\text{NUM\_ZERO}/(\text{NUM\_ZERO}+\text{NUM\_NOT\_ZERO}) \qquad (3)$$

That is, the probability is equal to the number of zeros remaining unread in the bitset divided by the total number of unread bits (NUM_ZERO+NUM_NOT_ZERO). Alternatively, the technique 1200 can read the next bit with a probability of the bit being a 1 using the probability of equation (4).

$$P(BITSET[I]=1)=NUM\_NOT\_ZERO/ \\ (NUM\_ZERO+NUM\_NOT\_ZERO) \quad (4)$$

At 1210, the technique 1200 updates NUM_ZERO or NUM_NOT_ZERO, as described with respect to 910 of FIG. 9. At 1212, the technique 1200 updates the variable I to prepare for reading the next bit of the bitset.

As the technique 1200 loops until all 1 bits are read, when the technique 1200 reaches 1214, then there may still be some unread 0 bits. Thus, at 1214, the technique 1200 sets any remaining unread bits to 0. The remaining bits are those from index I to length of the bitset minus 1. Equivalently, the remaining bits are those from index I to the maximum value (MAX_VAL) of the range.

To illustrate, assume that the bitset to be decoded is 0011011011011. Thus, the number of 1 bits is 8 and the length of the bitset is 13 (or, equivalently, the range can be [0, 12]. Thus, the number of zero bits is 5.

The technique 1200 reads BITSET[0] with a probability of 5/13 that the bit is 0. Since the bit is indeed 0, NUM_ZERO is decremented to 4 and the total number of bits remaining to read is 12. The technique 1200 then reads BITSET[1] with a probability of 4/12 that the bit is 0. Since the bit is indeed 0, NUM_ZERO is decremented to 3 and the total number of bits remaining to read is 11. The technique 1200 then reads BITSET[2] with a probability of 3/11 that the bit is 0. As the bit is 1, the technique 1200 decrements NUM_NOT_ZERO to 7. The technique 1200 then reads BITSET[3] with a probability of 3/10 that the bit is 0. And so on.

Figure 13:
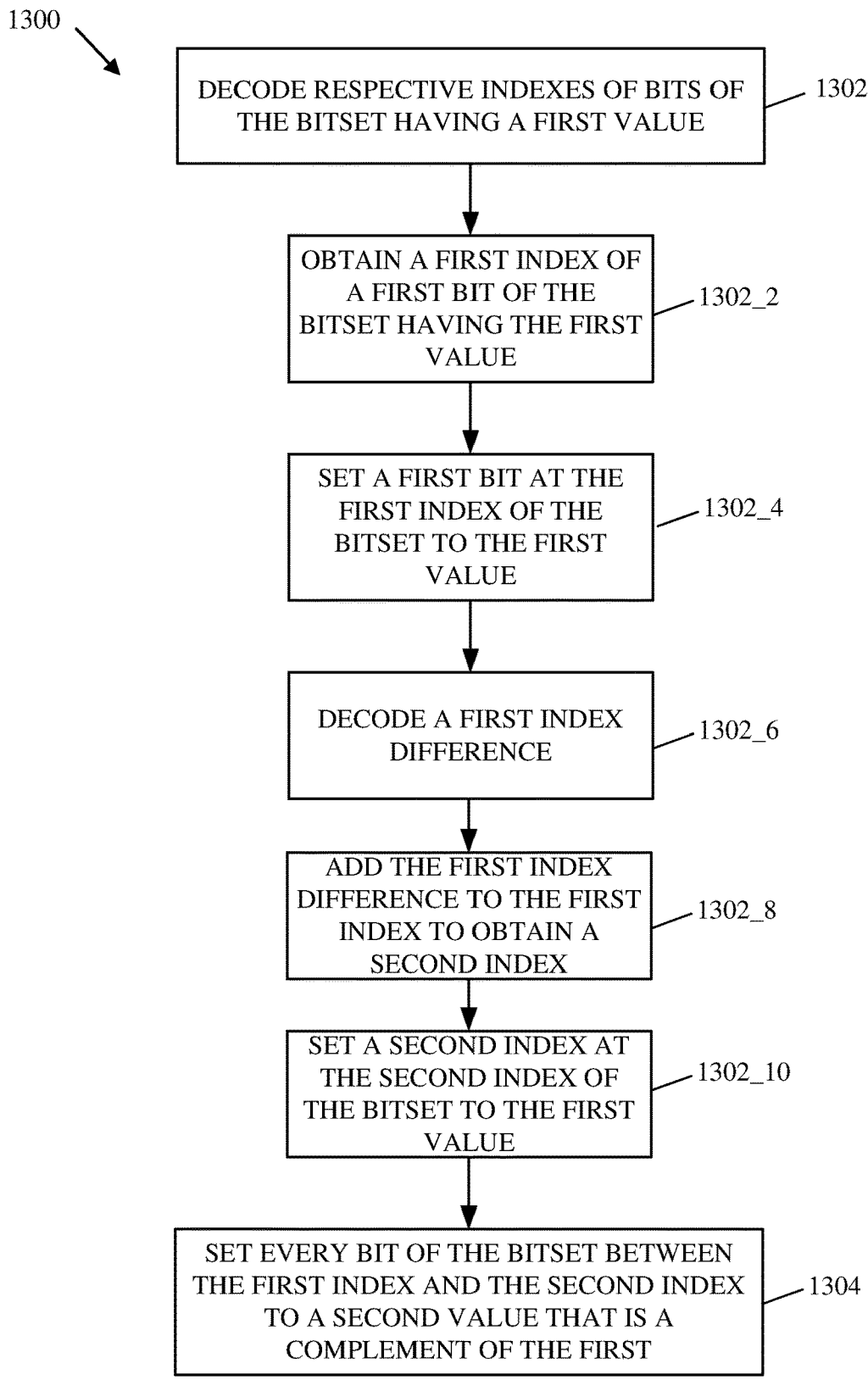
FIG. 13 is an example of a flowchart of a technique for decoding a bitset using many values, big range technique according to implementations of this disclosure.

FIG. 13 is an example of a flowchart of a technique 1300 for decoding a bitset according to implementations of this disclosure. The bitset represents occupancy or presence information of values within a range. The technique 1300 can be used in situations where a relatively large number of all the possible values in the range are present and where the range is relatively large. To give an illustrative example, the range can be [0, 255] and the number of present values can be 74. For ease of reference, the technique of FIG. 13 is referred to as the "many values, big range" (MV_BR) technique.

The technique 1300 can be implemented, for example, as a software program that may be executed by computing and communication devices such as one of the computing and communication devices 100A, 100B, 100C of FIG. 1. The software program can include machine-readable instructions that may be stored in a memory such as the memory 110 of FIG. 1, and that, when executed by a processor, such as the processor 120 of FIG. 1, can cause the computing and communication device to perform the technique 1300. The technique 1300 can be implemented in whole or in part in the entropy decoding unit 510 of the decoder 500 of FIG. 5. The technique 1300 can be implemented using specialized hardware or firmware. Multiple processors, memories, or both, may be used.

For the purposes of explaining the technique 1300, and without loss of generality, let the bitset BITSET be 00000111110...011000...0, where the bitset length is 256 bits and the bits at indexes [5, 6, 7, 8, 9, 23, 24] are set to 1.

The technique 1300 reads from the bitstream index differences. That is, instead of reading the indexes $[i_0, i_1, i_2, i_3, \ldots, i_{N-2}, i_{N-1}]$, the technique 1300 reads $[i_0, i_1-i_0, i_2-i_1, i_3-i_2, \ldots, i_{N-2}-i_{N-3}, i_{N-1}-i_{N-2}]$, which require less bits to store in the compressed bitstream than the indexes themselves. As such, instead of [5, 6, 7, 8, 9, 23, 24], the technique 1300 reads [5, 1, 1, 1, 1, 14, 1]. As the difference between an index and a next index is at least one, in some implementations, the technique 1300 can read $[i_0, i_1-i_0-1, i_2-i_1-1, i_3-i_2-1, \ldots, i_{N-2}-i_{N-3}-1, i_{N-1}-i_{N-2}-1]$. Thus, the technique 1300 can read [5, 0, 0, 0, 0, 13, 0]. The explanation below uses the index differences [5, 1, 1, 1, 1, 14, 1].

To be clear, the term "index differences," as used herein and for ease of explanation, encompasses the index itself of the first index. That is, the value "5" is the index itself and is also encompassed by the term "index differences;" whereas the remaining values (i.e., 1, 1, 1, 1, 14, 1) are true index differences.

The technique 1300 reads the index differences in batches. Each batch includes a size in bits (i.e., SIZE, a field 1416A) of the index differences within the batch that are to be read using the SIZE number of bits, a number of the index differences in the batch (i.e., NUM_OF_DIFFS, a field 1418), and all of the NUM_OF_DIFFS index differences themselves.

FIG. 14 is an example of a diagram 1400 for explaining a compressed bitstream format that is used with many values, big range according to implementations of this disclosure.

A row 1402 shows the index differences that are read by the technique 1300, which are [5, 1, 1, 1, 1, 14, 1]. A row 1404 shows the contents, in bits, of the compressed bitstream. A row 1406 describes what each set of bits represents. As mentioned above, the technique 1300 reads the index differences in batches. The compressed bitstream is illustrated as including four batches; namely batches 1408-1414.

Which index differences are included in which batches is determined by an encoder that encodes the row 1404. There can be many ways for the encoder to group the index differences into batches.

In an example, the encoder can select the batches (i.e., how to group the index differences into batches) based on a grouping that minimizes the number of bits required to encode the index differences.

In an example, the encoder can include within a batch all subsequent index differences to a first index difference within a batch that can be decoded with the same or smaller number of bits than the first index. For example, given the sequence [5, 1, 1, 2, 11] of index differences, the first index difference (i.e., 5) requires 3 bits. Thus, the encoder can group the index differences 5, 1, 1, and 2 into one batch. The index difference 11 requires 4 bits. Therefore 11 is not included in the same batch.

In an example, the encoder can group, within the same batch, all those subsequent index differences to a first index difference of the batch that can be encoded by no less than a threshold number of bits less than the first index. For example, if the threshold is 1, then as "5" requires 3 bits, but the subsequent index difference "1" needs no more than 1 bit, the "1" is not included in the same batch as the 5 because 3−1>threshold (i.e., 1). Thus, the batch would only include the index difference 5 and a new batch is then started.

Each of the indexes is a value that is greater than or equal 0 and less than the length of the bitset. If, for the example, the length is 256 bits, then each of the indexes is in the range [0, 255]. As the maximum index is 255, the number of bits required to represent the index is 7 bits. That is, the number of bits required to encode an index is in the range [0, 7], which itself can be encoded in 3 bits. The SIZE field (i.e., the fields 1416A-1416D) is, in FIG. 14, shown as a 3-bit field. More generally, given a bitset of length L, then the SIZE field can be encoded in ceiling($\log_2(\log_2(\text{length}))$). The SIZE field can be coded using the range coder knowing that the SIZE is in the range [0, log$_2$(length)]. The field 1418 (i.e., the NUM_OF_DIFFS field) can be coded using the range coder. The field 1418 is in the range [1, num of elements left].

The row 1404 is interpreted (and therefore read) by the technique 1300 as follows: Each index difference of the next batch requires 3 bits (i.e., 011) to be read; there is one index difference in the batch; that value is 5 (i.e., binary 101); each index difference of the next batch requires 1 (i.e., 001) bit to be read; there are 4 (i.e., 100) index differences in the batch; those values are 1, 1, 1, and 1; each index difference of the next batch requires 4 bits (i.e., 100) to be read; there is one index difference in the batch; that value is 14 (i.e., binary 1110); each index difference of the next batch requires 1 bit to be read; there is one index difference in the batch; that value is 1 (i.e., binary 1).

The decoder can infer that there are no more batches in the compressed bitstream. For example, if the last index difference that is read corresponds to the last bit of the bitset, then the decoder can infer that there are no more batches. The decoder can infer that there are no more batches in the compressed bitstream because, for example, it is known in advance how many indexes are to be read.

In an example, the index differences in a batch can be inferred. For example, if the SIZE is 1, then the values of the index differences need not be included in the bitstream because only one possible index difference is possible with 1 bit; namely, an index difference of 1.

Returning to FIG. 13. At 1302, the technique 1330 decodes, from a compressed bitstream, respective indexes of bits of the bitset having a first value. The respective indexes include a first index and a second index. The first index and the second index are consecutive indexes that are decoded from the compressed bitstream. That is, the technique 13 does not decode any other index between the first index and the second index. Decoding the respective indexes of the bits can include the steps 1302_2 to 1302_8.

At 1302_2, the technique 1300 obtains the first index of a first bit of the bitset having the first value. Assuming that the bitset is read from the left to right, "first bit," as used herein and unless the context otherwise indicates, does not necessarily mean the left most bit of the bitset. If the first index is the very first index (i.e., "5" in [5, 6, 7, 8, 9, 23, 24]), then obtaining the first index can mean reading (e.g., decoding) the first index from the compressed bitstream. If the first index is not the very first index, then obtaining the first index can include decoding an index difference from the compressed bitstream and adding the index difference plus 1 to an immediately preceding index. That is, for example, the technique 1300 can read the index difference 14 of the batch 1412 of FIG. 14 and add it to the immediately preceding index, 9, to obtain 14+9=23 (i.e. the second index).

At 1302_4, the technique 1300 sets a first bit at the first index of the bitset to the first value. For example, upon obtaining the index 23, the technique 1300 set BITSET[23] =1. At 1302_6, the technique 1300 decodes, from the compressed bitstream, a first index difference. For example, assuming that the first index is 9, then the first index difference would be the index difference 14. At 1302_8, the technique 1300 adds the first index difference (e.g., 14) to the first index (e.g., 9) to obtain a second index (e.g., 23). At 1302_10, the technique 1300 sets the second index at the second index of the bitset to the first value. That is, for example, the technique 1300 sets BITSET[23]=1.

At 1304, the technique 1300 sets every bit of the bitset, if any, between the first index and the second index to a second value that is a complement of the first. For example, using the indexes [5, 6, 7, 8, 9, 23, 24] of FIG. 14, the first index can be the index 9 and the second can be 23. Thus, whereas the 9$^{th}$ bit (i.e., the bit at index 9) and 25$^{th}$ bit (i.e., the bit at index 23) of the bitset have the first value (e.g., 1), the technique 1300 sets the 10$^{th}$ to the 24$^{th}$ bits of the bitset to the complement of the first value (e.g., 0). If the first index is 5 and the second index is 6, then, as no bits exist between the 5$^{th}$ and 6$^{th}$ bits, no bits are set to the complement of the first value.

As described with respect to FIG. 14, the index differences can be decoded in batches. Thus, decoding the respective indexes of the bits can include decoding, from the compressed bitstream, a size (e.g., SIZE) in bits; decoding, from the compressed bitstream, a number of index differences (e.g., NUM_OF_DIFFS); and decoding, from the compressed bitstream, each of the index differences using a number of bits that is equal to the size in bits (i.e., SIZE). Decoding the size in bits can include decoding the size in bits using ceiling(log$_2$(log$_2$(length))) bits, wherein length is the length of the bitset. In some examples, and as mentioned above, decoding, from the compressed bitstream, each of the index differences using a number of bits that is equal to the size in bits can include inferring the index differences.

In an example, the technique 1300 can further include decoding, from the compressed bitstream, a coding mode that indicates the range and the number of the indexes of the bits of the bitset. For example, the technique 1300 may be able to decode a bitset using many different decoding techniques. Thus, the compressed bitstream can include (i.e., included by an encoder) a coding mode indicating to the technique 1300 that the MV_BR technique is to be used for decoding the bitset. In an example, the coding mode can precede the field 1416A of FIG. 14.

As described above, a decoder can decode a bitset using several different bitset decoding techniques. Which technique the decoder uses can be indicated in the compressed bitstream using a coding mode. The coding mode can be one of FV_BR, FV_SR, MV_SR, or MV_BR. In this case, as there are four modes, the coding mode can be read from the bitstream using 2 bits. For example, after reading the coding mode from the compressed bitstream, the decoder can decode the bitset according to the coding mode.

An encoder determines the coding mode. In an example, the encoder can test-encode the bitset using each of the available coding modes and select the coding mode that results in the smallest number of bits in the compressed bitstream. While short-hand names (i.e., FV_BR, FV_SR, MV_SR, or MV_BR) were used in this disclosure to easily refer to the different bitset coding techniques, such names do not limit in any way how an encoder chooses the coding mode for a particular bitset.

FIG. 15 is an example of a portion 1500 of a compressed bitstream according to implementations of this disclosure. The portion 1500 includes a field 1502 that indicates the coding mode that the decoder should use when decoding (e.g., reconstructing) a bitset using the data in a field 1504, which encodes the bitset according to the coding mode of the field 1502.

For simplicity of explanation, the techniques 600, 800, 900, 1100, 1200, and 1300 of FIGS. 6, 8, 9, 11, 12, and 13, respectively, are depicted and described as series of steps or operations. However, the steps or operations in accordance with this disclosure can occur in various orders and/or concurrently. Additionally, other steps or operations not presented and described herein may be used. Furthermore, not all illustrated steps or operations may be required to implement a method in accordance with the disclosed subject matter.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise or clear from context, "X includes A or B" is intended to mean any of the natural inclusive permutations thereof. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. As used herein, the terms "determine" and "identify," or any variations thereof, include selecting, ascertaining, computing, looking up, receiving, determining, establishing, obtaining, or otherwise identifying or determining in any manner whatsoever using one or more of the devices shown in FIG. 1.

Further, for simplicity of explanation, although the figures and descriptions herein may include sequences or series of operations or stages, elements of the methods disclosed herein can occur in various orders and/or concurrently. Additionally, elements of the methods disclosed herein may occur with other elements not explicitly presented and described herein. Furthermore, one or more elements of the methods described herein may be omitted from implementations of methods in accordance with the disclosed subject matter.

The implementations of the transmitting computing and communication device 100A and/or the receiving computing and communication device 100B (and the algorithms, methods, instructions, etc., stored thereon and/or executed thereby) can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably. Further, portions of the transmitting computing and communication device 100A and the receiving computing and communication device 100B do not necessarily have to be implemented in the same manner.

Further, in one implementation, for example, the transmitting computing and communication device 100A or the receiving computing and communication device 100B can be implemented using a computer program that, when executed, carries out any of the respective methods, algorithms, and/or instructions described herein. In addition or alternatively, for example, a special-purpose computer/processor, which can contain specialized hardware for carrying out any of the methods, algorithms, or instructions described herein, can be utilized.

The transmitting computing and communication device 100A and the receiving computing and communication device 100B can, for example, be implemented on computers in a real-time video system. Alternatively, the transmitting computing and communication device 100A can be implemented on a server, and the receiving computing and communication device 100B can be implemented on a device separate from the server, such as a hand-held communications device. In this instance, the transmitting computing and communication device 100A can encode content using an encoder 400 into an encoded video signal and transmit the encoded video signal to the communications device. In turn, the communications device can then decode the encoded video signal using a decoder 500. Alternatively, the communications device can decode content stored locally on the communications device, for example, content that was not transmitted by the transmitting computing and communication device 100A. Other suitable transmitting computing and communication device 100A and receiving computing and communication device 100B implementation schemes are available. For example, the receiving computing and communication device 100B can be a generally stationary personal computer rather than a portable communications device, and/or a device including an encoder 400 may also include a decoder 500.

Further, all or a portion of implementations can take the form of a computer program product accessible from, for example, a tangible computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or semiconductor device. Other suitable mediums are also available. The above-described implementations have been described in order to allow easy understanding of the application and are not limiting. On the contrary, the application covers various modifications and equivalent arrangements included within the scope of the appended claims, which scope is to be accorded the broadest interpretation as is permitted under the law so as to encompass all such modifications and equivalent arrangements.

What is claimed is:

1. An apparatus for decoding a bitset, each bit of the bitset corresponding to a respective value in a range of a minimum value to a maximum value, the apparatus comprising: a processor configured to:

decode, from a compressed bitstream, indexes of bits of the bitset, each bit of the bits having a first value, wherein to decode the indexes of the bits of the bitset comprises to:

decode, from the compressed bitstream, a number of the indexes of the bits of the bitset; decode a first index of the indexes in a first range having a first lower bound and a first upper bound, wherein: the first lower bound is equal to the minimum value, the first upper bound is equal to the maximum value minus the number of the indexes of the bits of the bitset having the first value minus 1, and the first index corresponds to a first bit of the bitset having the first value;

decode a last index of the indexes in a second range having a second lower bound and a second upper bound, wherein: the second lower bound is equal to the first index plus the number of the indexes minus one,
the second upper bound is equal to the maximum value,
and the last index corresponds to a last bit of the bitset
having the first value;
decrement by one a number of remaining indexes after
decoding an index from the compressed bitstream; and
decode, from the compressed bitstream, a next index
immediately after decoding a previous index that was
decoded immediately after decoding a next previous
index, wherein to decode the next index comprises to:
set a lower bound of a remaining range to the previous
index plus the number of remaining indexes; set an
upper bound of the remaining range to the next previous index minus 1; and decode, from the compressed
bitstream, the next index in the remaining range; and
set all other bits of the bitset not decoded from the
compressed bitstream to a second value.

2. The apparatus of claim 1, wherein the processor is configured to:
decode, from the compressed bitstream, a coding mode, wherein the coding mode is indicative of the range and the number of the indexes of the bits of the bitset.

3. The apparatus of claim 1, wherein the first value is 1 and the second value is 0.

4. The apparatus of claim 1,
wherein the lower bound of the remaining range is set to the next previous index plus 1; and
wherein the upper bound of the remaining range is set to the previous index minus the number of remaining indexes.

5. The apparatus of claim 1, wherein the minimum value is 0 and the maximum value is 255.

6. A method for decoding a bitset, each bit of the bitset corresponding to a respective value in a range of a minimum value to a maximum value, the method comprising:
decoding, from a compressed bitstream, indexes of bits of the bitset, each bit of the bits having a first value, wherein decoding the indexes of the bits of the bitset comprises to:
decoding, from the compressed bitstream, a number of the indexes of the bits of the bitset;
decoding a first index of the indexes in a first range having a first lower bound and a first upper bound, wherein:
the first lower bound is equal to the minimum value,
the first upper bound is equal to the maximum value minus the number of the indexes of the bits of the bitset having the first value minus 1, and
the first index corresponds to a first bit of the bitset having the first value; and
decoding a last index of the indexes in a second range having a second lower bound and a second upper bound, wherein:
the second lower bound is equal to the first index plus the number of the indexes minus one,
the second upper bound is equal to the maximum value, and
the last index corresponds to a last bit of the bitset having the first value;
decrementing by one a number of remaining indexes after decoding an index from the compressed bitstream; and
decoding, from the compressed bitstream, a next index immediately after decoding a previous index that was decoded immediately after decoding a next previous index, wherein decoding the next index comprises:
setting a lower bound of a remaining range to the previous index plus the number of remaining indexes;
setting an upper bound of the remaining range to the next previous index minus 1; and
decoding, from the compressed bitstream, the next index in the remaining range; and
setting all other bits of the bitset not decoded from the compressed bitstream to a second value.

7. The method of claim 6, further comprising:
decoding, from the compressed bitstream, a coding mode, wherein the coding mode is indicative of the range and the number of the indexes of the bits of the bitset.

8. The method of claim 6, wherein the first value is 1 and the second value is 0.

9. The method of claim 6,
decoding, from the compressed bitstream, a next index immediately after decoding a previous index that was decoded immediately after decoding a next previous index, wherein to decode the next index comprises to:
wherein the lower bound of the remaining range is set to the next previous index plus 1; and
wherein the upper bound of the remaining range is set to the previous index minus the number of remaining indexes.

10. The method of claim 6, wherein the minimum value is 0 and the maximum value is 255.

11. A non-transitory computer-readable storage medium, comprising executable instructions that, when executed by a processor, facilitate performance of operations for decoding a bitset, each bit of the bitset corresponding to a respective value in a range of a minimum value to a maximum value, the operations comprising:
decoding, from a compressed bitstream, indexes of bits of the bitset, each bit of the bits having a first value, wherein decoding the indexes of the bits of the bitset comprises to:
decoding, from the compressed bitstream, a number of the indexes of the bits of the bitset;
decoding a first index of the indexes in a first range having a first lower bound and a first upper bound, wherein:
the first lower bound is equal to the minimum value,
the first upper bound is equal to the maximum value minus the number of the indexes of the bits of the bitset having the first value minus 1, and
the first index corresponds to a first bit of the bitset having the first value; and
decoding a last index of the indexes in a second range having a second lower bound and a second upper bound, wherein:
the second lower bound is equal to the first index plus the number of the indexes minus one,
the second upper bound is equal to the maximum value, and
the last index corresponds to a last bit of the bitset having the first value;
decrementing by one a number of remaining indexes after decoding an index from the compressed bitstream; and
decoding, from the compressed bitstream, a next index immediately after decoding a previous index that was decoded immediately after decoding a next previous index,
wherein to decode the next index comprises to:
setting a lower bound of a remaining range to the previous index plus the number of remaining indexes:
setting an upper bound of the remaining range to the next previous index minus 1; and
decoding, from the compressed bitstream, the next index in the remaining range; and setting all other bits of the bitset not decoded from the compressed bitstream to a second value.

12. The non-transitory computer-readable storage medium of claim 11, the operations further comprising:
decoding, from the compressed bitstream, a coding mode, wherein the coding mode is indicative of the range and the number of the indexes of the bits of the bitset.

13. The non-transitory computer-readable storage medium of claim 11, wherein the first value is 1 and the second value is 0.

14. The non-transitory computer-readable storage medium of claim 11,
wherein the lower bound of the remaining range is set to the next previous index plus 1;
and wherein the upper bound of remaining range is set to the previous index minus the number of remaining indexes.

* * * * *